United States Patent
Ozaki et al.

(10) Patent No.: US 12,193,151 B2
(45) Date of Patent: Jan. 7, 2025

(54) HIGH-FREQUENCY CIRCUIT BOARD AND ANTENNA MODULE

(71) Applicant: Fujitsu Limited, Kawasaki (JP)

(72) Inventors: Shirou Ozaki, Yamato (JP); Naoya Okamoto, Isehara (JP); Yoshihiro Nakata, Atsugi (JP); Yusuke Kumazaki, Atsugi (JP); Toshihiro Ohki, Hadano (JP); Naoki Hara, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 18/157,489

(22) Filed: Jan. 20, 2023

(65) Prior Publication Data

US 2023/0354507 A1 Nov. 2, 2023

(30) Foreign Application Priority Data

Mar. 30, 2022 (JP) .................. 2022-056168

(51) Int. Cl.
*H05K 1/02* (2006.01)
*H01Q 1/12* (2006.01)
*H05K 1/11* (2006.01)

(52) U.S. Cl.
CPC ............. *H05K 1/0243* (2013.01); *H01Q 1/12* (2013.01); *H05K 1/115* (2013.01); *H05K 2201/10098* (2013.01)

(58) Field of Classification Search
CPC ................ H05K 1/0243; H05K 1/115; H05K 2201/10098; H01Q 1/12
USPC ........................................................ 361/783
See application file for complete search history.

(56) References Cited

U.S. PATENT DOCUMENTS

| | | | |
|---|---|---|---|
| 2003/0006063 A1* | 1/2003 | Otsuka | H05K 1/0242 174/262 |
| 2006/0043585 A1 | 3/2006 | Sukegawa et al. | |
| 2012/0182705 A1* | 7/2012 | Hardin | H05K 1/0231 361/783 |

FOREIGN PATENT DOCUMENTS

| | | |
|---|---|---|
| JP | 2006-093659 A | 4/2006 |
| JP | 2009-159202 A | 7/2009 |

* cited by examiner

*Primary Examiner* — Andargie M Aychillhum
(74) *Attorney, Agent, or Firm* — ArentFox Schiff LLP

(57) ABSTRACT

A high-frequency circuit board includes: a first insulating layer having a first dielectric constant; a first metal layer provided to stack over the first insulating layer; a second insulating layer provided to stack over the first metal layer, and having a second dielectric constant lower than the first dielectric constant; a second metal layer provided to stack over the second insulating layer, on which a compound semiconductor device is mounted; and first vias penetrating the second insulating layer and connecting the first metal layer with the second metal layer.

9 Claims, 40 Drawing Sheets

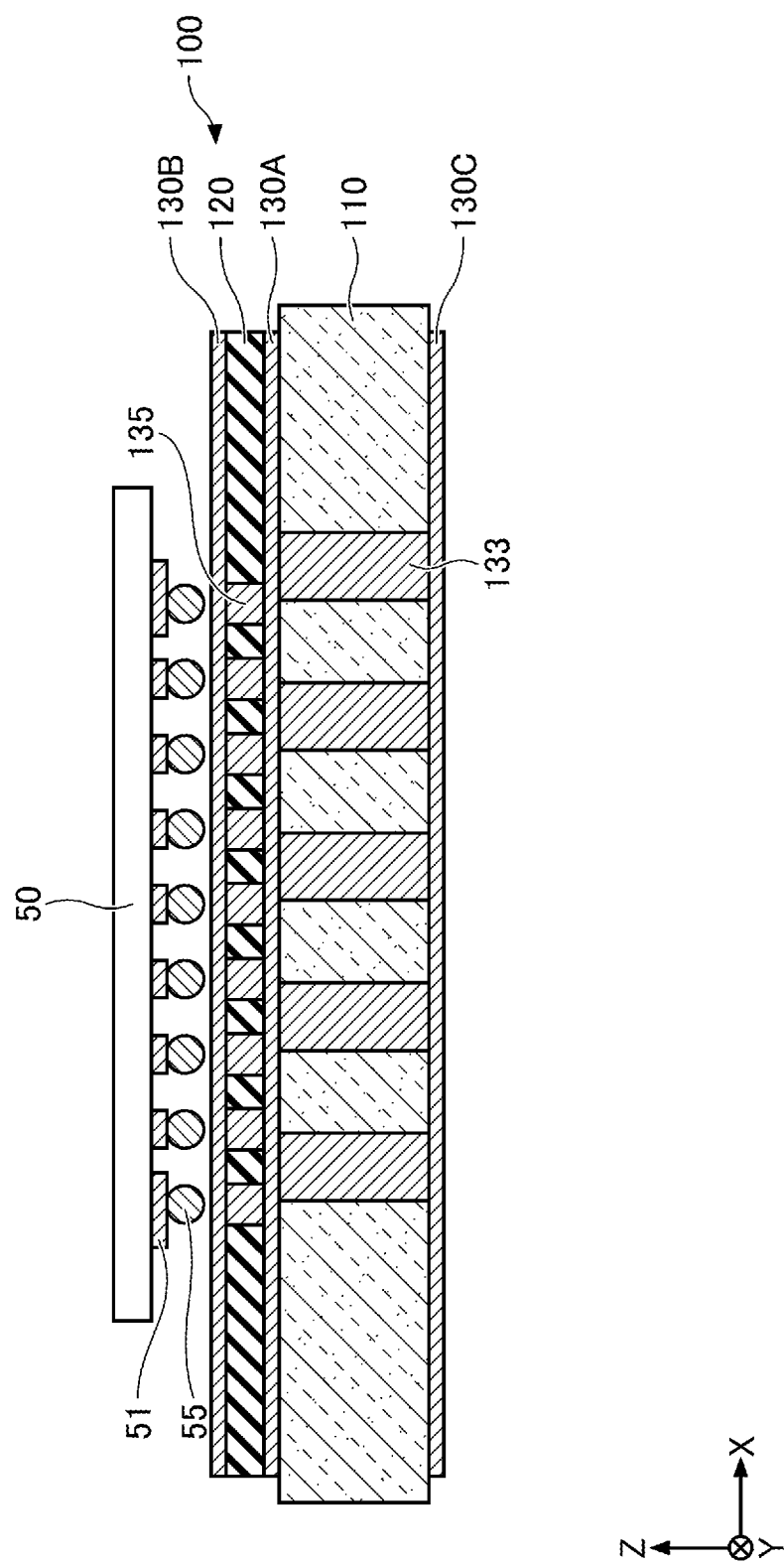

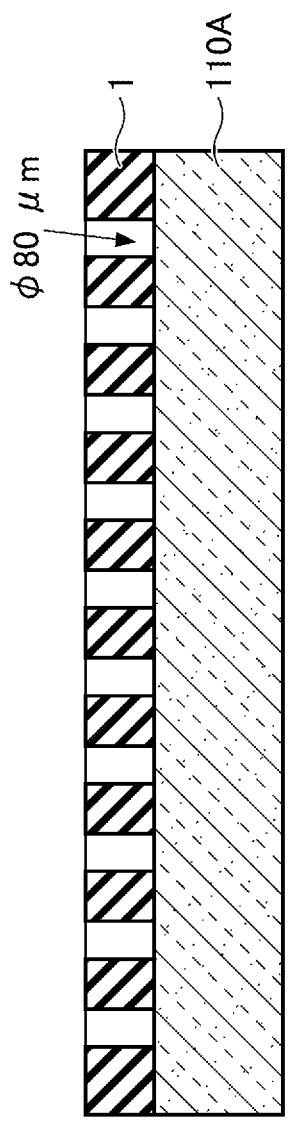

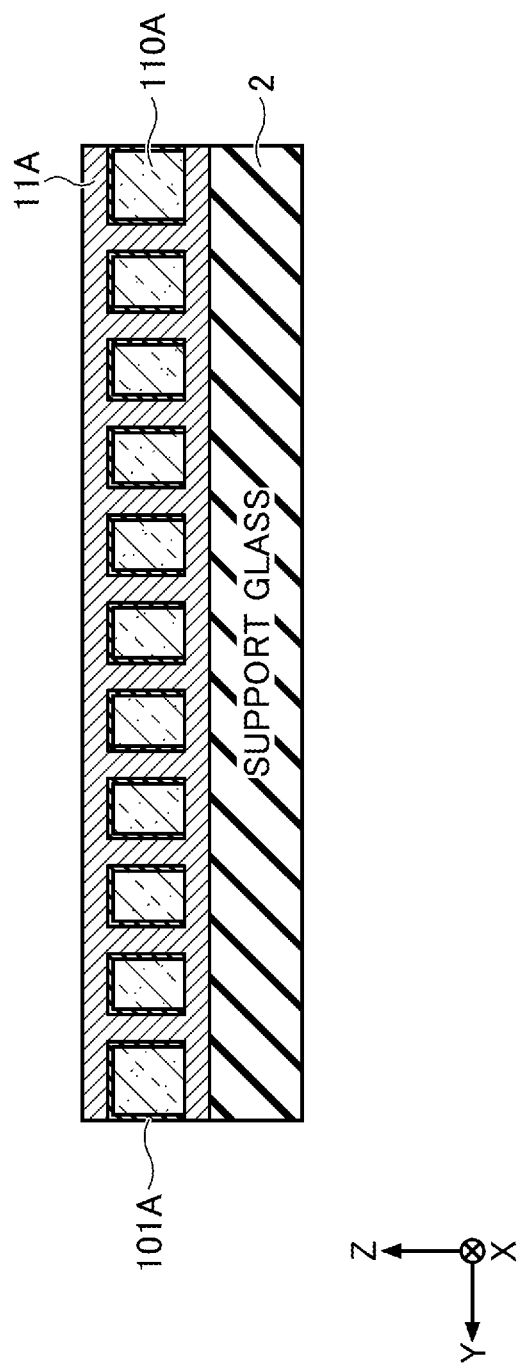

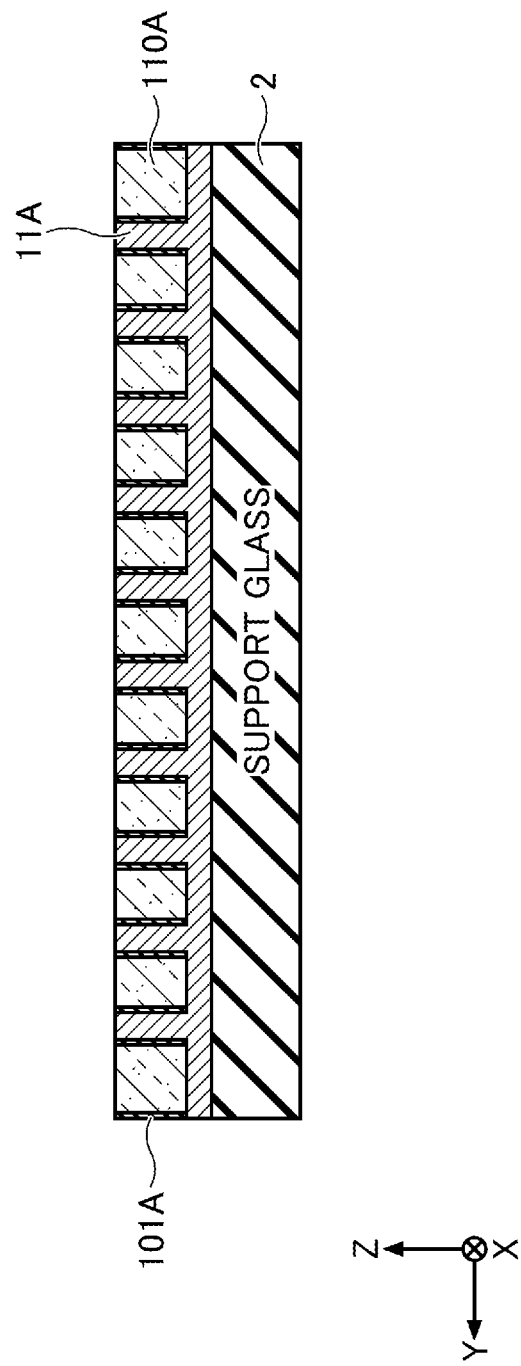

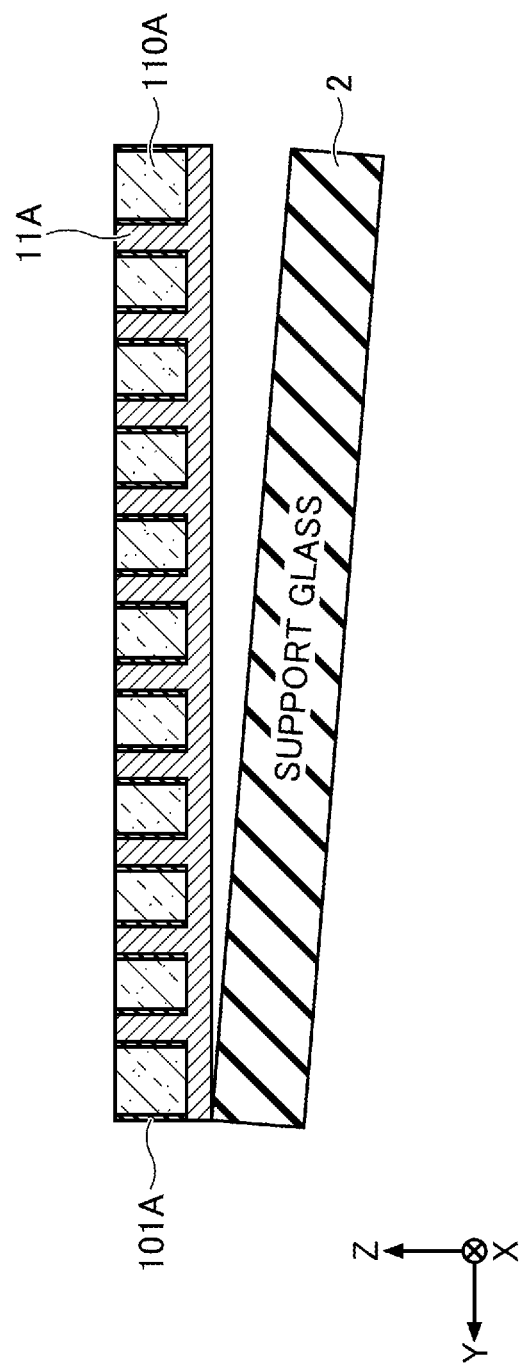

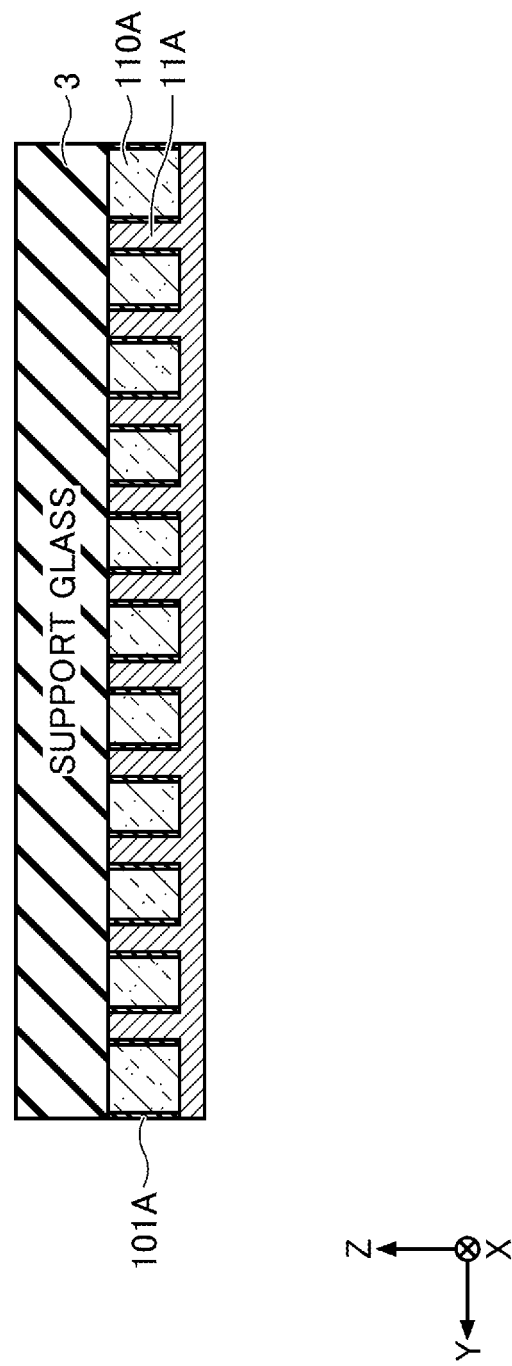

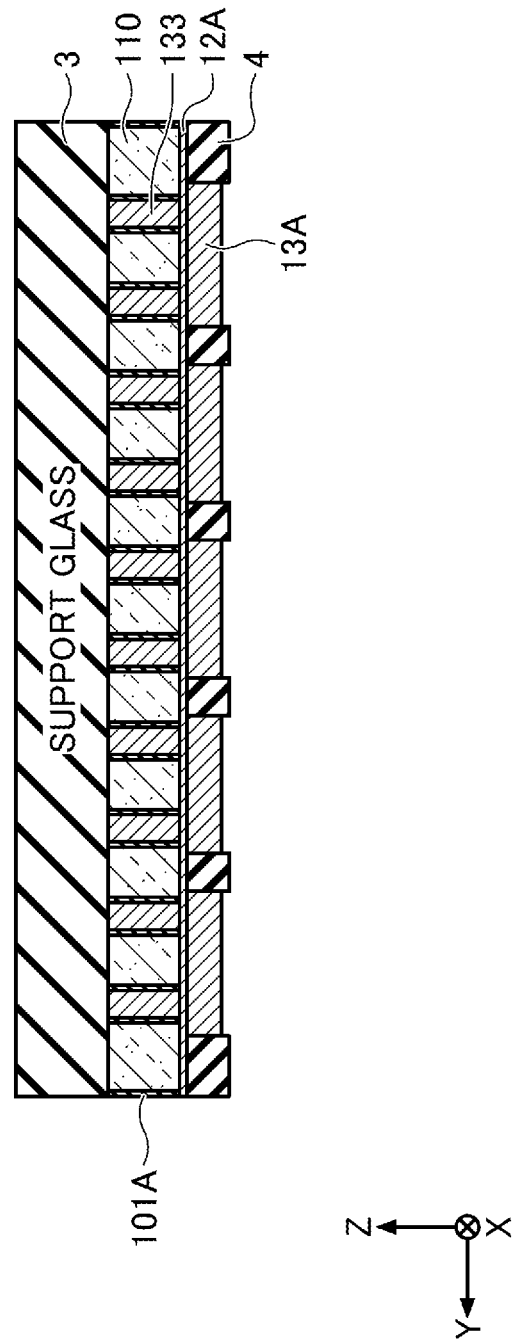

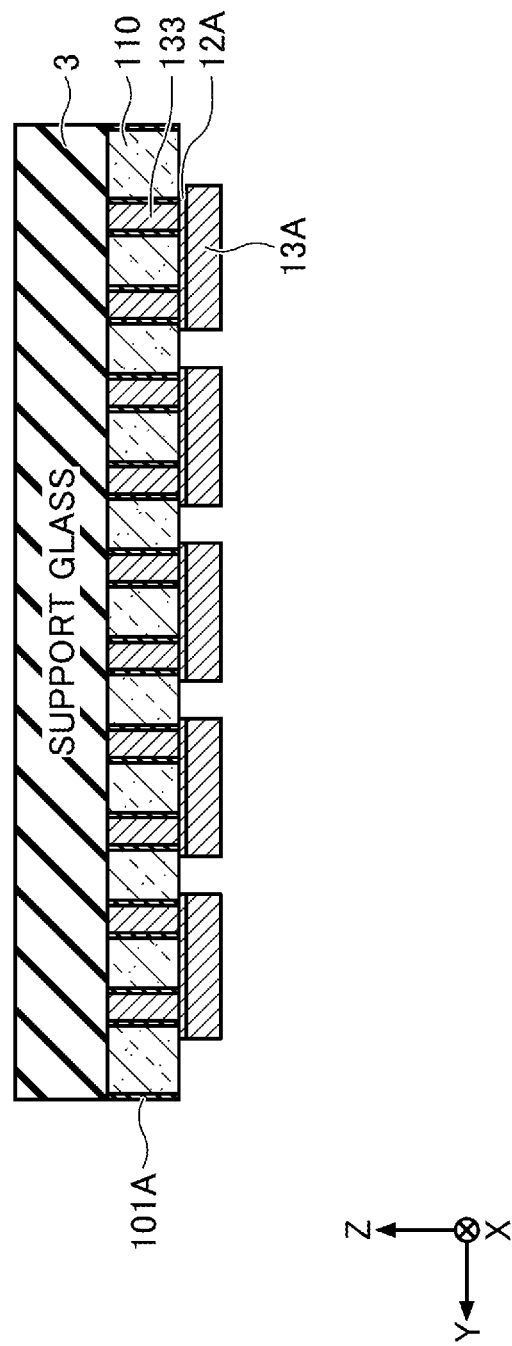

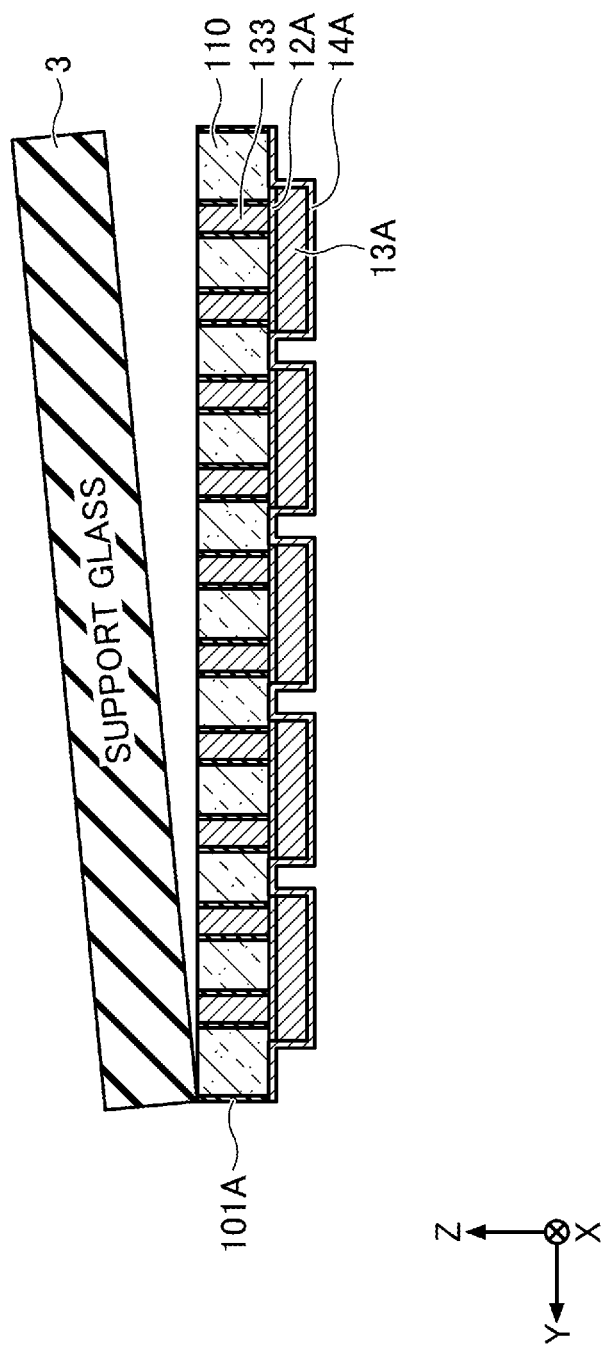

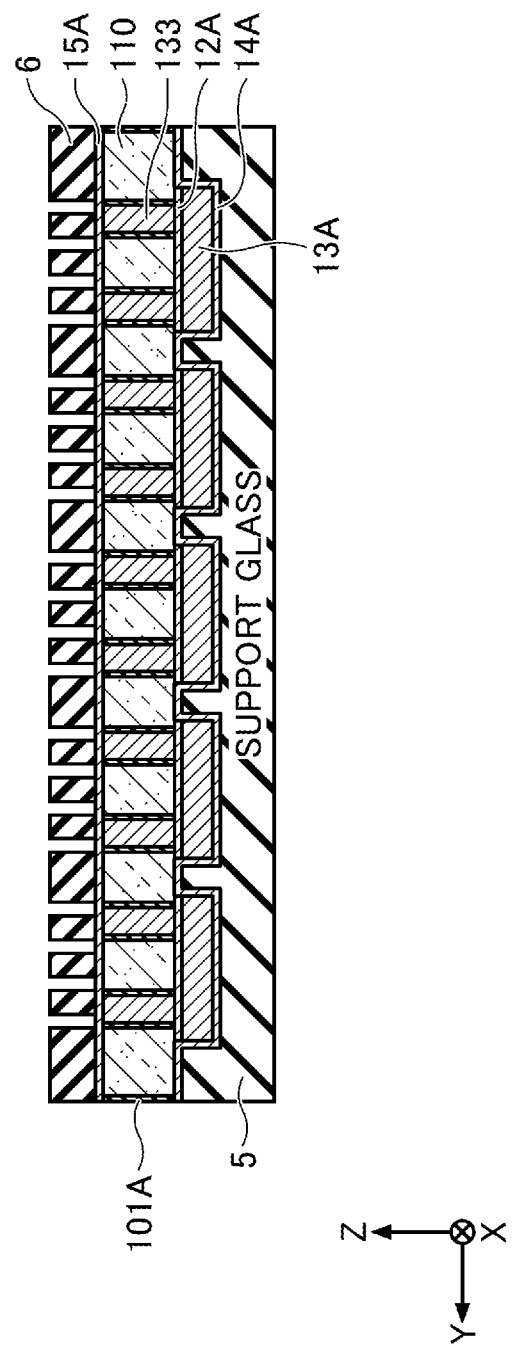

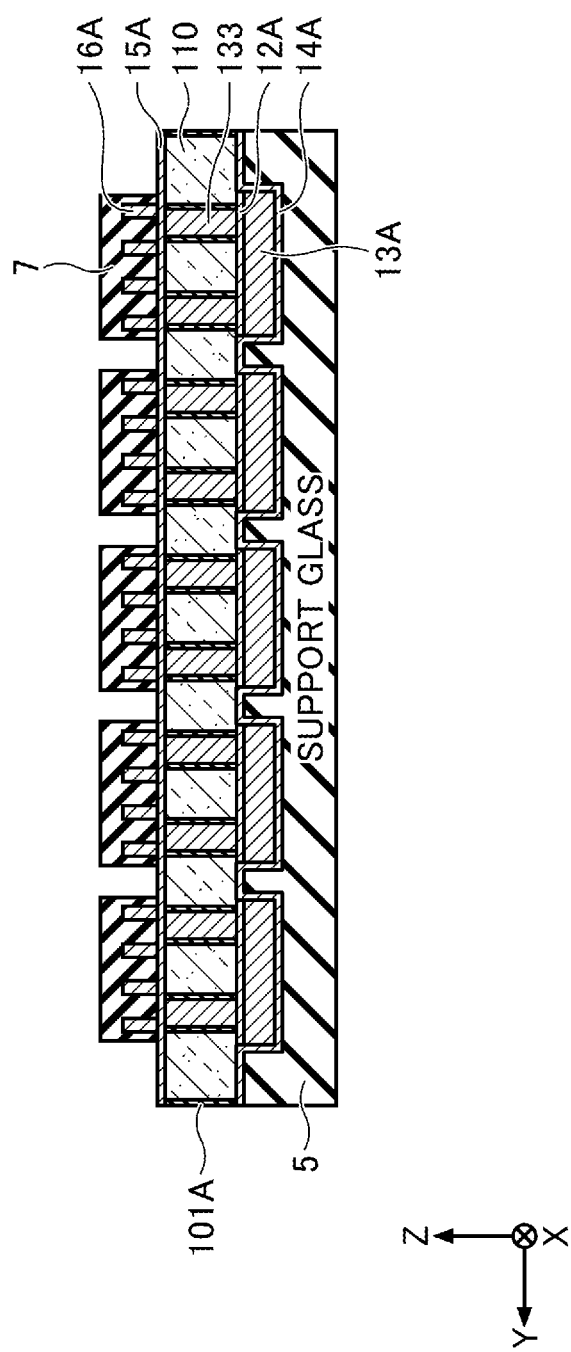

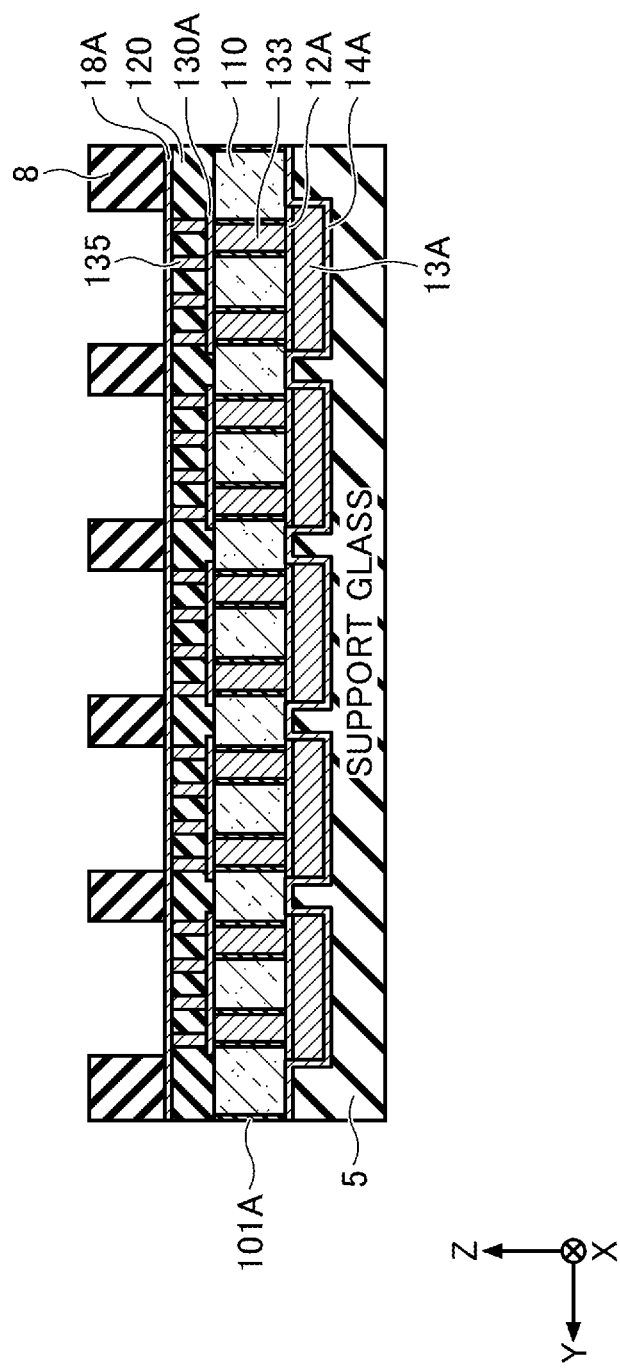

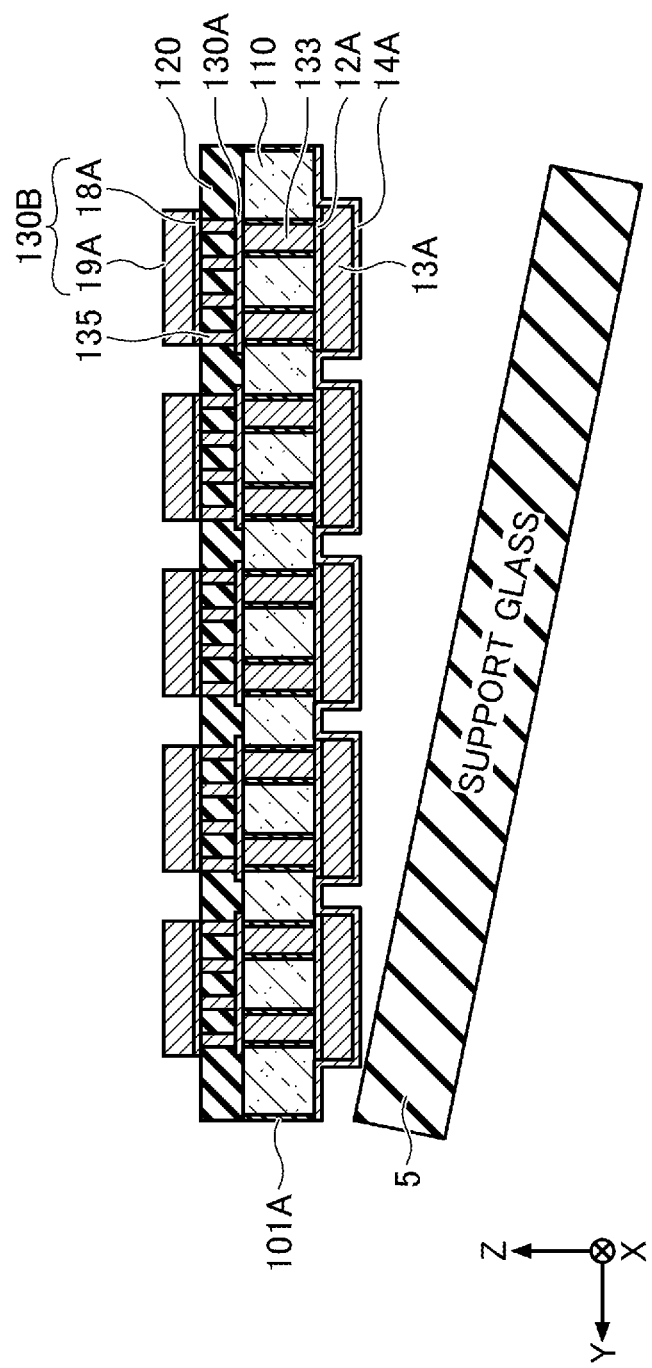

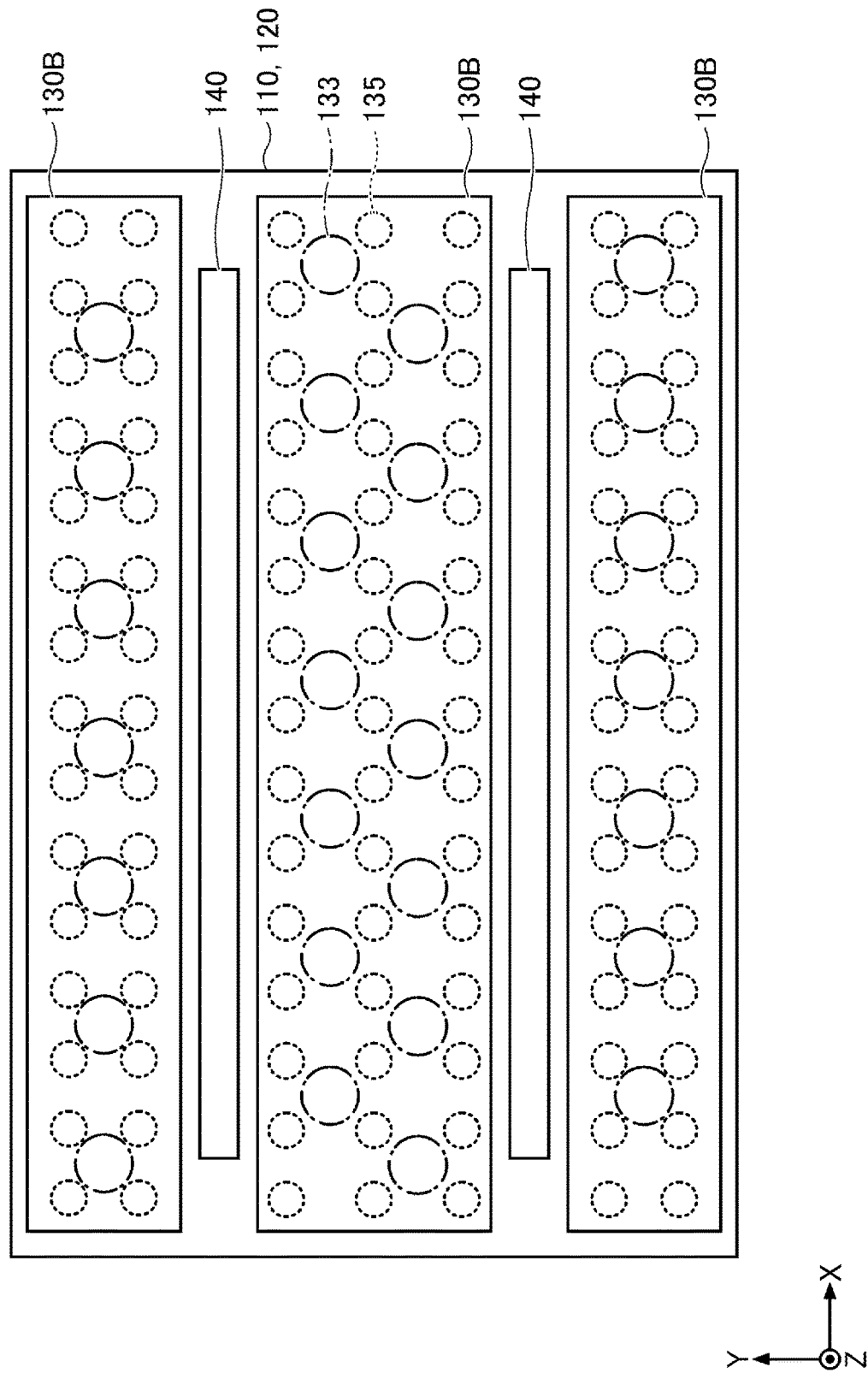

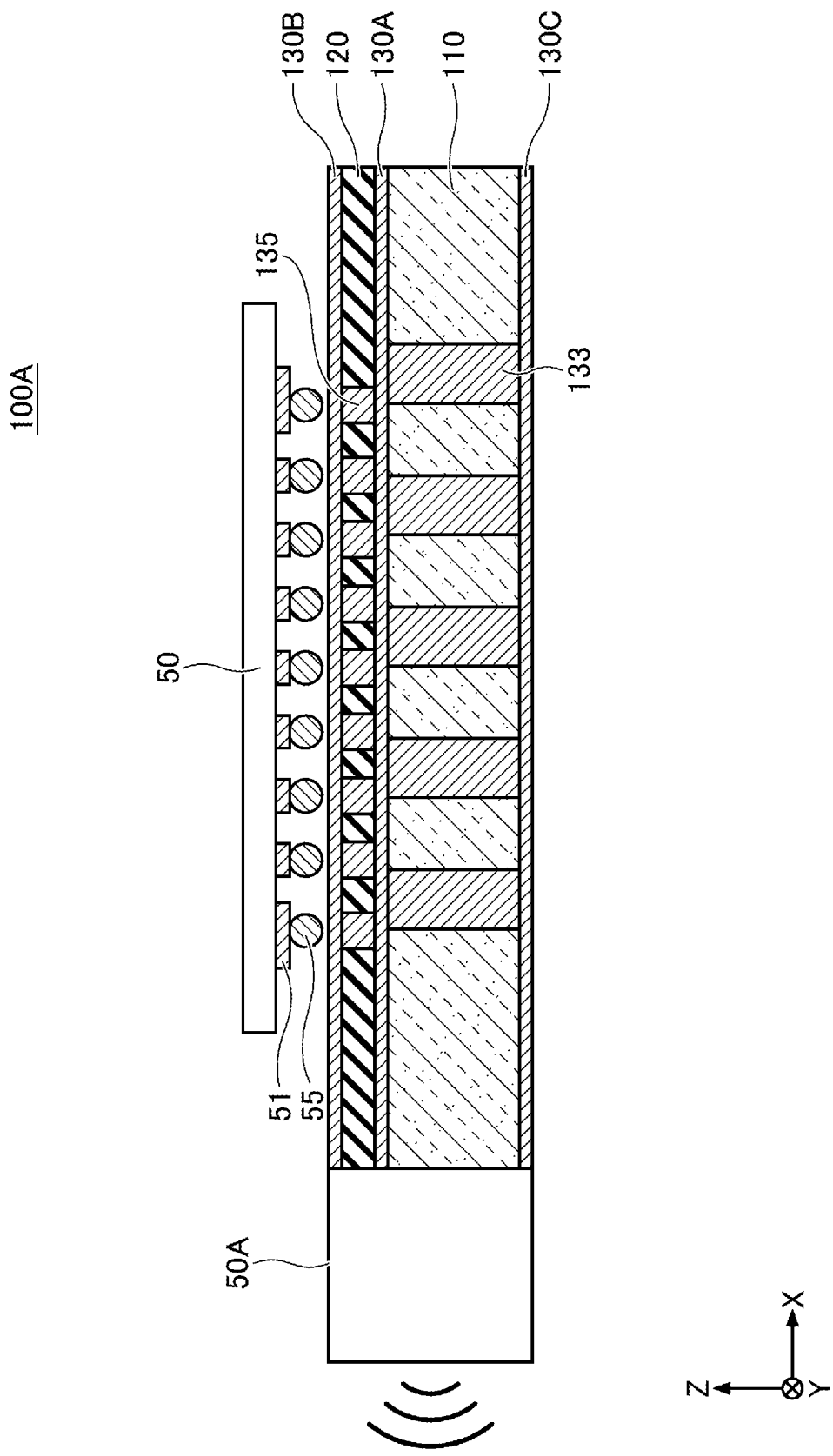

HIGH-FREQUENCY CIRCUIT BOARD AND ANTENNA MODULE

CROSS-REFERENCE TO RELATED APPLICATIONS

The present application is based upon and claims the benefit of priority of Japanese Patent Application No. 2022-056168 filed on Mar. 30, 2022, the entire contents of which are hereby incorporated by reference.

FIELD

The present disclosure relates to a high-frequency circuit board and an antenna module.

BACKGROUND

Conventionally, there is a mounting structure that includes a board having a plane in the thickness direction, wherein the plane includes a first surface to mount electronic components (semiconductor devices) and a second surface substantially parallel to the first surface. The board includes an input/output circuit arranged in a first region on the plane in which electronic components are mounted, or in a second region in which multiple transmission parts to transmit signals with another board are intensively formed on the plane, wherein the input/output circuit includes an output circuit formed corresponding to each of the multiple transmission parts, to output a signal to a corresponding transmission part of the other board; and an input circuit to receive as input a signal from a corresponding transmission part of the other board. The board includes a control circuit arranged in the first or second region, to control input and output of the input/output circuit. The electronic components are connected to the board via bumps (e. g., see Patent Document 1).

RELATED ART DOCUMENTS

Patent Documents

[Patent Document 1] Japanese Laid-Open Patent Application No. 2006-093659

Meanwhile, such a conventional mounting structure does not assume high-frequency signals at 100 GHz or higher. If inputting high-frequency signals at 100 GHz or higher into a semiconductor device, a problem of heat generation arises. In the case where the board is made of a dielectric material, although high-frequency characteristics are good, there is a problem that heat dissipation is unsatisfactory. In contrast, in the case where the board is made of a material having high heat dissipation, such as SiC (silicon carbide), AlN (aluminum nitride), or Si (silicon), high-frequency characteristics are unsatisfactory due to the high dielectric constant.

SUMMARY

According to an embodiment in the present disclosure, a high-frequency circuit board includes: a first insulating layer having a first dielectric constant; a first metal layer provided to stack over the first insulating layer; a second insulating layer provided to stack over the first metal layer, and having a second dielectric constant lower than the first dielectric constant; a second metal layer provided to stack over the second insulating layer, on which a compound semiconductor device is mounted; and first vias penetrating the second insulating layer and connecting the first metal layer with the second metal layer.

The object and advantages in the embodiment will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWING

FIG. 1 is a diagram illustrating a high-frequency circuit board 100 of an embodiment;

FIG. 2A is a diagram illustrating a method of manufacturing the high-frequency circuit board 100;

FIG. 4A is a diagram illustrating the method of manufacturing the high-frequency circuit board 100;

FIG. 4B is a diagram illustrating the method of manufacturing the high-frequency circuit board 100;

FIG. 4C is a diagram illustrating the method of manufacturing the high-frequency circuit board 100;

FIG. 5A is a diagram illustrating the method of manufacturing the high-frequency circuit board 100;

FIG. 6A is a diagram illustrating the method of manufacturing the high-frequency circuit board 100;

FIG. 6B is a diagram illustrating the method of manufacturing the high-frequency circuit board 100;

FIG. 6D is a diagram illustrating the method of manufacturing the high-frequency circuit board 100;

FIG. 7C is a diagram illustrating the method of manufacturing the high-frequency circuit board 100;

FIG. 8B is a diagram illustrating the method of manufacturing the high-frequency circuit board 100;

FIG. 9C is a diagram illustrating the method of manufacturing the high-frequency circuit board 100;

FIG. 10C is a diagram illustrating the method of manufacturing the high-frequency circuit board 100;

FIG. 11 is a diagram illustrating a simulation model of the high-frequency circuit board 100;

FIG. 13 is a diagram schematically illustrating a configuration of an antenna module 100A.

DESCRIPTION OF EMBODIMENTS

Background of Disclosure

Figure 2B:
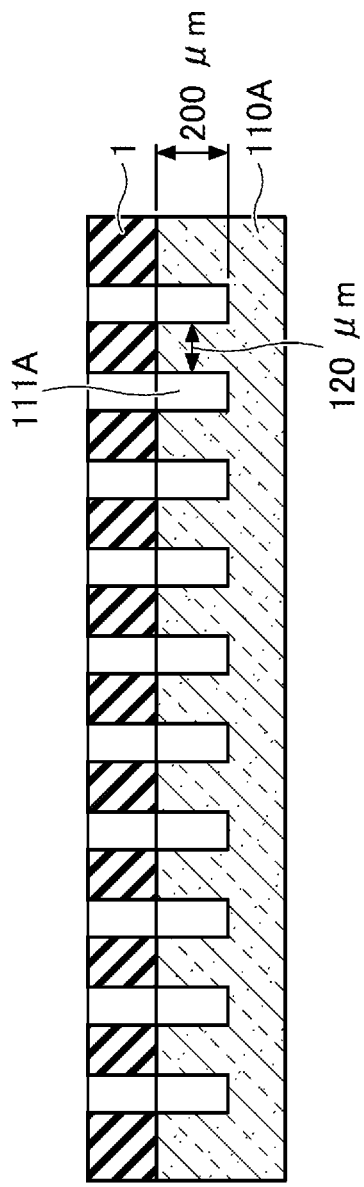
FIG. 2B is a diagram illustrating the method of manufacturing the high-frequency circuit board 100.

In the following, embodiments according to the present disclosure will be described based on the drawings. According to an embodiment, a high-frequency circuit board having good heat dissipation and high-frequency characteristics, and an antenna module can be provided. Before describing the embodiments in detail, first, the background of the present disclosure will be described.

In a mobile communication system for what-is-called "Beyond 5G (5th Generation)" or 6G (6th Generation), it is necessary to implement high-performance, high-capacity communication (100 Gbps or higher) significantly exceeding 5G. For example, in a wireless personal area network (WPAN) as one of the use cases, it is expected to transmit high-definition video exceeding 8K and advanced video data including holograms to individual users, that are required in telemedicine, remote control in factories, and the like. In order to achieve that, improvement of the transmission speed is essential, and use of "terahertz waves" around 300 GHz that can secure a wider bandwidth than conventional microwaves and millimeter waves, is considered as a candidate. Note that when using these ultra-high frequency radio waves, not limited to WPAN, it is essential to construct a phased array antenna that emits beams only in a required direction for purposes of ensuring the reachable range of the radio waves and of reducing power consumption. However, it is difficult for the output of 300 GHz-band array antennas using CMOS (Complementary Metal Oxide Semiconductor) or SiGe based amplifiers reported in the past, to secure the communication distance assumed in use cases. Therefore, it is necessary to extend the communication distance and to increase the directivity of radio waves, by using higher power amplifiers using compound semiconductors such as gallium nitride (GaN) and indium phosphorus (InP) and integrating these with antennas to form an array.

In a very high frequency band exceeding 100 GHz, it has been reported that losses in solder and wire bonding parts used for joining elements at the front end of radio transmission and reception, such as amplifiers, mixers, and phase shifters, adversely affect the high frequency characteristic of modules. In order to address this issue, various multi-element integration techniques are being developed; however, in order to apply those to array antennas in a 300-GHz band, energy radiation in unnecessary directions (grating lobes) needs to be suppressed, and the size, gain, and antenna pitch of one antenna element need to be designed so as to make the beam deflection angle (beam angle) controllable. Also, it is necessary to analyze effects of alignment accuracy when rewiring elements, on wiring resistance and loss, and to examine layout of elements and wiring materials to suppress such effects. Further, if making an amplifier smaller for higher integration, the output is reduced and more elements are required, and hence, arraying becomes more difficult. Therefore, consideration is required to increase the output of the amplifier and to reduce the number of elements, and further, as heat generation becomes serious in an amplifier having higher output, a heat dissipation structure that takes into consideration the influence on wiring materials, such as warp of a mold substrate used for integration, is required.

Resin materials such as polyimide widely used for high-frequency circuit boards, have low thermal conductivity; therefore, when an amplifier is mounted by flip-chip packaging and stacked three-dimensionally, heat generation becomes serious. In contrast, if a substrate of SiC, AlN, Si, or the like having high thermal conductivity is used instead of a resin substrate, the high-frequency characteristic deteriorates due to influence of the dielectric constant and dielectric loss. Here, the reason why an insulating, high-heat radiation substrate is required, is to secure a bias line between the stacked substrates, and it is difficult to use a metal plate as the substrate. Also, although the thickness of the substrate for high frequencies needs to be controlled at least to be less than ¼ (≤100 μm) of the wavelength of a signal in a very high frequency band to prevent resonance, a problem of strength may arise depending on the material.

In the following, a high-frequency circuit board in the present disclosure with which the problems described above are solved, and an embodiment to which an antenna module is applied will be described.

In the following, an XYZ coordinate system is defined for description. Also, for the sake of convenience of description, the negative Z direction side will be referred to as the lower side or downward, and the positive Z direction side will be referred to as the upper side or upward; however, these do not represent universal vertical relationships. Also, viewing the XY plane from above will be referred to as the plan view.

EMBODIMENTS

FIG. 1 is a diagram illustrating a high-frequency circuit board 100 of an embodiment. The high-frequency circuit board 100 includes an insulating layer 110, an insulating layer 120, metal layers 130A, 130B, and 130C, and vias 133 and 135. By holding the metal layer 130C at ground potential (an example of reference potential), the metal layers 130A, 130B, and 130C are all held at ground potential. Above the metal layer 130 of the high-frequency circuit board 100, a power amplifier 50 is mounted via bumps 55. Although the high-frequency circuit board 100 also includes transmission lines for signals connected to the power amplifier 50, these lines are omitted in FIG. 1.

<Power Amplifier 50>

The power amplifier 50, as an example, is built into a transmission circuit of a base station, and is connected to an antenna not illustrated in FIG. 1. The power amplifier 50 is an example of a compound semiconductor device made of a compound semiconductor such as gallium nitride (GaN), indium phosphorus (InP), or the like for an ultra-high frequency band exceeding 100 GHz. For example, the power amplifier 50 may be a compound semiconductor device made of gallium nitride (GaN) in the case where the frequency of radio waves communicated through the antenna is within a range of 100 GHz to 200 GHz, or may be a compound semiconductor device made of indium phosphorus (InP) in the case where the frequency is close to 300 GHz.

Note that here, although a form will be described in which the compound semiconductor device executes amplification processing of a signal output to the antenna as signal processing in the power amplifier 50, the signal processing executed by the compound semiconductor device is not limited to such amplification processing. A compound semiconductor device operating in such an ultra-high frequency band generates a large amount of heat. Also, although only one power amplifier 50 is illustrated in FIG. 1, multiple compound semiconductor devices are sometimes used in a communication device used for public lines as used in a base station or the like, and in such a case, the amount of generated heat is even larger.

<Configuration of Parts of High-Frequency Circuit Board 100>

The insulating layer 110 is an example of a first insulating layer; and the insulating layer 120 is an example of a second insulating layer. The metal layer 130A is an example of a first metal layer; the metal layer 130B is an example of a second metal layer; and the metal layer 130C is an example of a third metal layer. The vias 133 are examples of a second via; and the vias 135 are examples of a first via.

The insulating layer 110 is positioned at a lower part of the high-frequency circuit board 100. The metal layer 130A is provided on the upper surface of the insulating layer 110, and the metal layer 130C is provided on the lower surface. Through holes are formed in the insulating layer 110 in the vertical direction in which the vias 133 are formed.

The insulating layer 110 is an insulating layer made of SiC, AlN, Si, or the like having high thermal conductivity. In order to function as a heat dissipation layer, the insulating layer 110 may have a thermal conductivity higher than that of the insulating layer 120. The insulating layer 110 has a thickness of greater than or equal to 100 μm. In order to improve the heat dissipation, the insulating layer 110 has a sufficient thickness.

The permittivity of the insulating layer 110 is an example of a first permittivity, and is higher than that of the insulating layer 120. SiC has a dielectric constant of 9.7, AlN has a dielectric constant of 8.5, and Si has a dielectric constant of 11.9.

The insulating layer 120 is provided over the metal layer 130A. The metal layer 130B is provided on the upper surface of the insulating layer 120. Through holes are formed in the insulating layer 120 in the vertical direction in which the vias 135 are formed. Although the insulating layer 120 is also provided with transmission lines for signals connected to the power amplifier 50, these lines are omitted in FIG. 1.

In order to prioritize obtaining a good high-frequency characteristic over heat dissipation, the insulating layer 120 is made of a material having a lower dielectric constant than the insulating layer 110. This is because, in addition to the metal layer 130B connected to the power amplifier 50, transmission lines for signals are also provided. The thickness of the insulating layer 120 may be less than ¼ of the wavelength A of a signal in a very high frequency band amplified by the power amplifier 50. This is to prevent the vias 135 from functioning as radiating elements. More specifically, it is favorable that the insulating layer 120 has a thickness of greater than or equal to 50 μm and less than or equal to 100 μm.

The dielectric constant of the insulating layer 120 is an example of a second dielectric constant. For the insulating layer 120, for example, a resin layer or a quartz layer can be used to achieve a low dielectric constant. The insulating layer 120 is made of, for example, a resin material such as polyimide, quartz, or the like. The permittivity of polyimide is 3.0, and the permittivity of quartz is 3.7. The insulating layer 120 can be made of a resin other than polyimide and quartz, and in this case, if using an insulating material having a dielectric constant of less than or equal to 4, a good high-frequency characteristic can be obtained.

The metal layer 130A is provided between the insulating layers 110 and 120. The metal layer 130A is provided to suppress propagation of signal components transmitted from the power amplifier 50 through the vias 135 to the vias 133 and the metal layer 130C. In other words, viewed from the vias 133 and the metal layer 130C, the signal components output from the power amplifier 50 through the vias 135 are blocked by the metal layer 130A.

The metal layer 130B is a metal layer provided over the upper surface of the insulating layer 120, to which ground terminals 51 of the power amplifier 50 are connected via bumps 55. The metal layer 130B is connected to the metal layer 130C via the vias 135, the metal layer 130A, and the vias 133, and thereby, held at ground potential.

The metal layer 130C is a metal layer that is positioned on the lowest side of the high-frequency circuit board 100; connected to a ground potential point of an electronic device in a base station or the like where the high-frequency circuit board 100 is provided via wiring or the like (not illustrated); and thereby, held at ground potential.

The vias 133 are what are called through hole vias formed in the through holes of the insulating layer 110. The vias 133 are provided to efficiently direct heat conducted from the metal layer 130B to the metal layer 130A, through the vias 135 to the metal layer 130C, and are thicker than the vias 135. This is to increase the thermal conductivity.

The vias 135 are provided in the through holes of the insulating layer 120 to connect the metal layers 130A and 130B. It is favorable to form the vias 135 at intervals of less than or equal to 300 μm to obtain a good high-frequency characteristic, and even more favorable to form those at intervals of less than or equal to 100 μm.

Note that the metal layers 130A and 130C that are provided on the upper surface and the lower surface of the insulating layer 110, respectively, are selectively formed on part of the upper surface and the lower surface of the insulating layer 110. This is to provide through hole vias in the insulating layer 110 that are connected to the upper surface and the lower surface of the insulating layer 120, and connected to the transmission lines for signals connected to the power amplifier 50, so as to ensure insulation between the through hole vias and the metal layers 130A and 130C.

<Manufacturing Method of High-Frequency Circuit Board 100>

FIGS. 2A to 10D are diagrams illustrating a method of manufacturing a high-frequency circuit board 100. FIGS. 2A to 10D illustrate cross sectional structures parallel to the YZ plane in manufacturing steps of the high-frequency circuit board 100. Also, here, as an example, a form in which the insulating layer 110 is made of Si, and the insulating layer 120 is made of polyimide, will be described.

First, as illustrated in FIG. 2A, a resist 1 is formed on an Si substrate 110A, and through holes each having a diameter of 80 µm are formed in the resist 1. The vias 133 are formed later in these through holes. The resist 1 can be formed by forming a resist film on the entire upper surface, executing photolithography, and then, removing unnecessary portions.

Next, as illustrated in FIG. 2B, for example, by executing dry etching by Bosch process or the like, holes 111A having a depth of greater than or equal to 200 µm are formed in the Si substrate 110A at intervals of 120 µm. The holes 111A do not completely penetrate the Si substrate 110A.

Figure 2C:
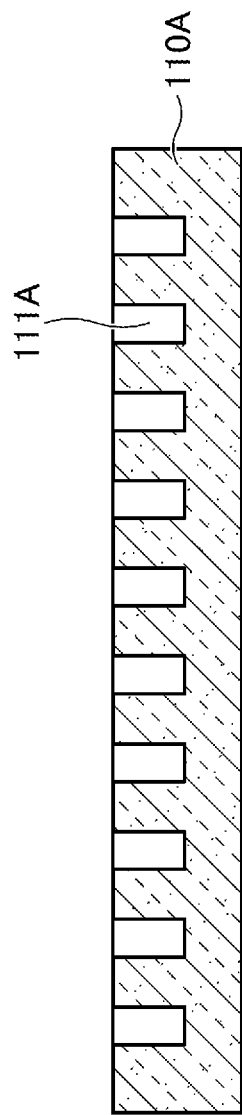
FIG. 2C is a diagram illustrating the method of manufacturing the high-frequency circuit board 100.

Next, the resist 1 is stripped by using, for example, a resist stripping solution or the like, to obtain the Si substrate 110A having the holes 111A formed, as illustrated in FIG. 2C.

Figure 2D:
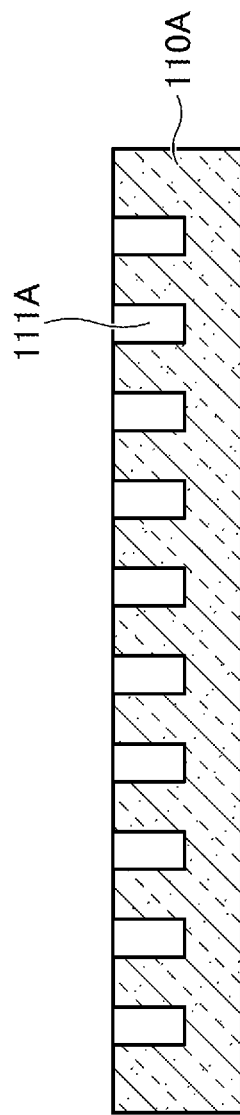
FIG. 2D is a diagram illustrating the method of manufacturing the high-frequency circuit board 100.

Next, ICP-RIE (Inductive Coupled Plasma Reactive Ion Etching) using a mixed gas of fluorine and helium ($F_2$+He) is applied to the Si substrate 110A illustrated in FIG. 2C, to flatten the inner side surface of the holes 111A in the Si substrate 110A (scallop reduction treatment), and the Si substrate 110A illustrated in FIG. 2D is obtained.

Figure 3A:
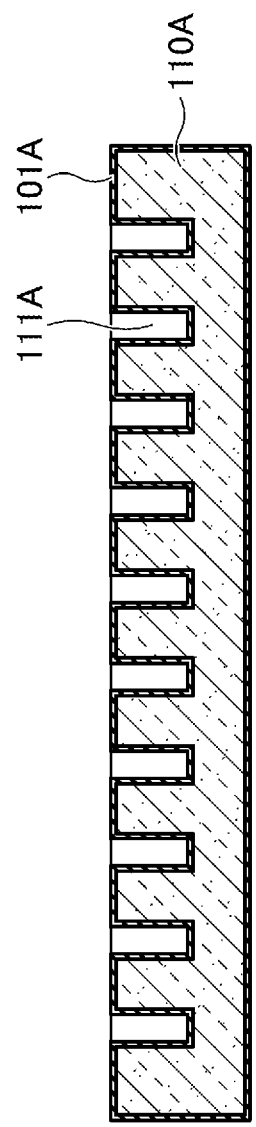
FIG. 3A is a diagram illustrating the method of manufacturing the high-frequency circuit board 100.

Next, thermal oxidation treatment is applied to the Si substrate 110A in FIG. 2D, to form a silicon oxide ($SiO_2$) layer 101A on the surfaces of the Si substrate 110A as illustrated in FIG. 3A.

Figure 3B:
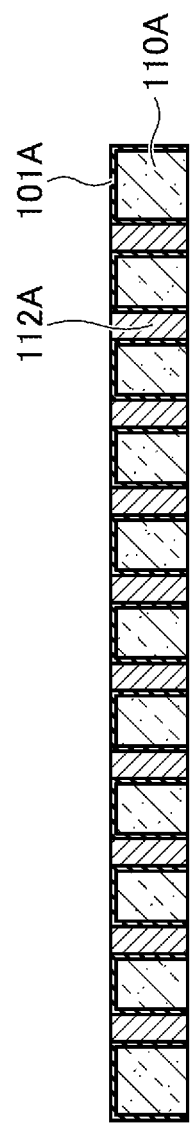
FIG. 3B is a diagram illustrating the method of manufacturing the high-frequency circuit board 100.

Next, by executing a back grinding process to scraping off the lower surface side, through holes 112A are formed as illustrated in FIG. 3B.

Figure 3C:
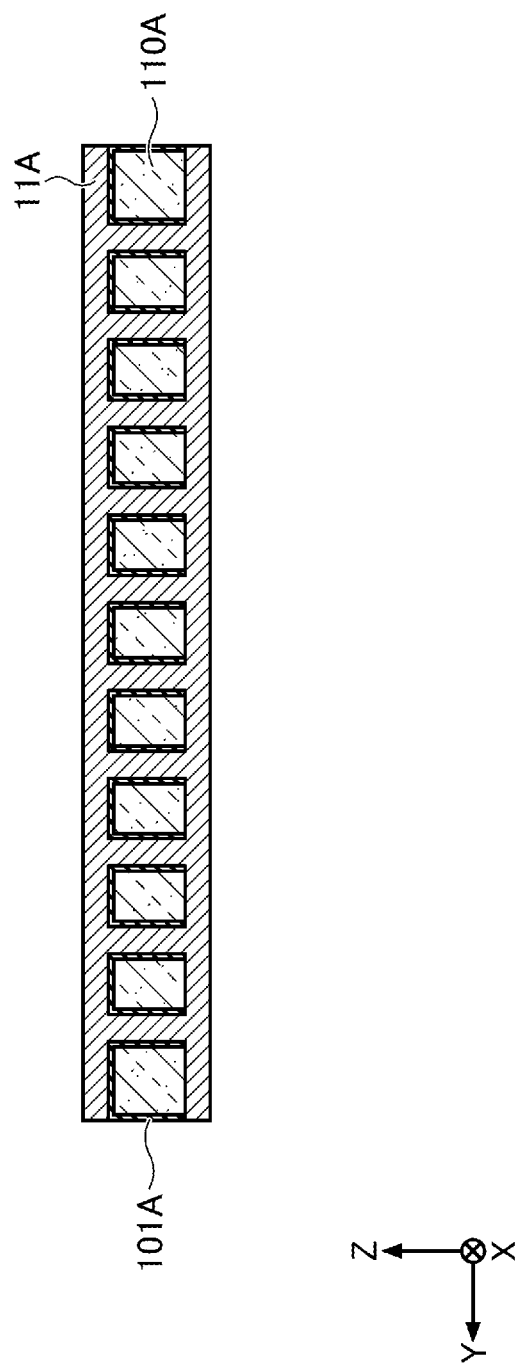
FIG. 3C is a diagram illustrating the method of manufacturing the high-frequency circuit board 100.

Next, a seed layer of Ti (titanium) and Cu (copper) is formed on the surfaces of the Si substrate 110A illustrated in FIG. 3B, and then, a Cu plating layer 11A is formed, as illustrated in FIG. 3C.

Next, as illustrated in FIG. 4A, a support glass 2 is attached to the lower surface.

Next, the upper surface is polished by CMP (Chemical Mechanical Polishing), to remove the Cu plating layer 11A on the upper surface side as illustrated in FIG. 4B.

Next, as illustrated in FIG. 4C, the support glass 2 on the lower surface side is stripped, and a support glass 3 is attached on the upper surface side, as illustrated in FIG. 5A.

Figure 5B:
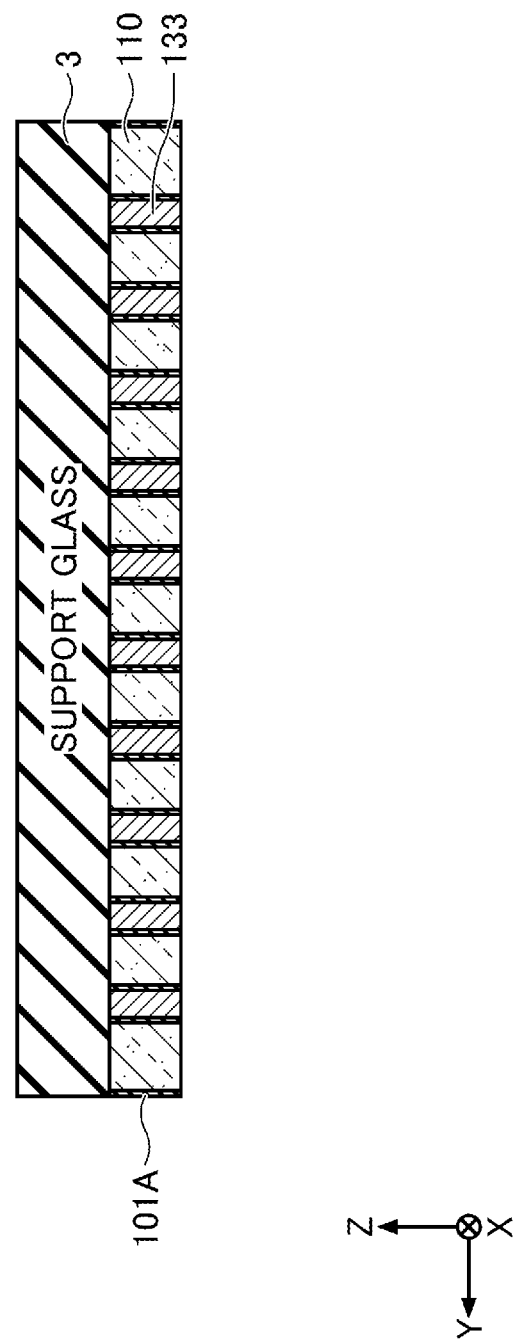
FIG. 5B is a diagram illustrating the method of manufacturing the high-frequency circuit board 100.

Next, by polishing the lower surface by CMP, the Si substrate 110A and the Cu plating layer 11A illustrated in FIG. 5A become the insulating layer 110 and the vias 133, as illustrated in FIG. 5B.

Figure 5C:
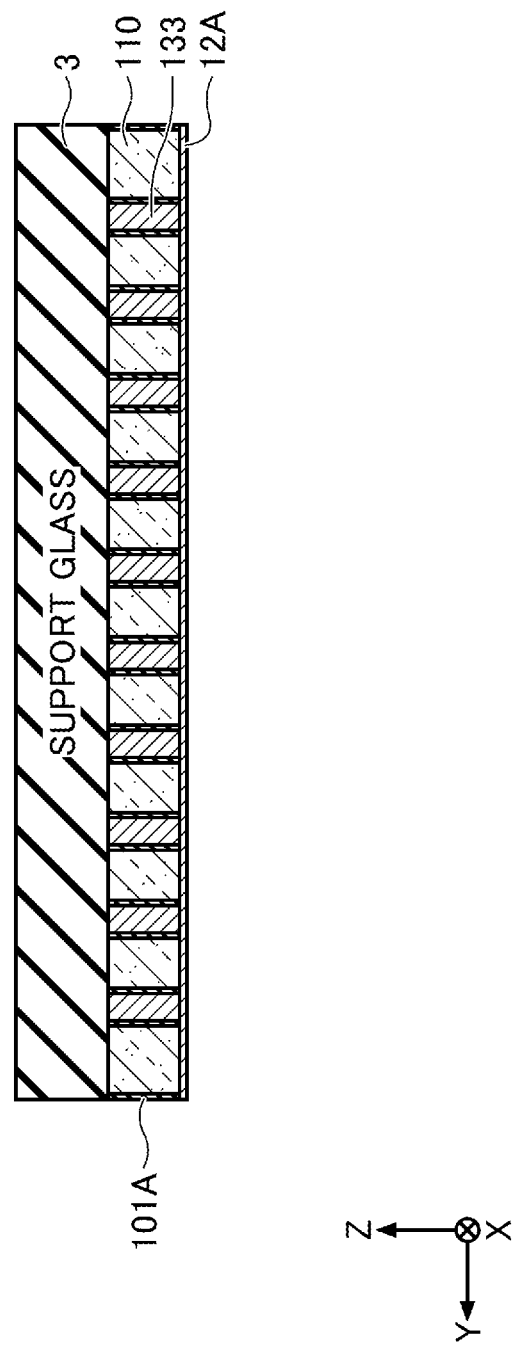
FIG. 5C is a diagram illustrating the method of manufacturing the high-frequency circuit board 100.
Figure 5D:
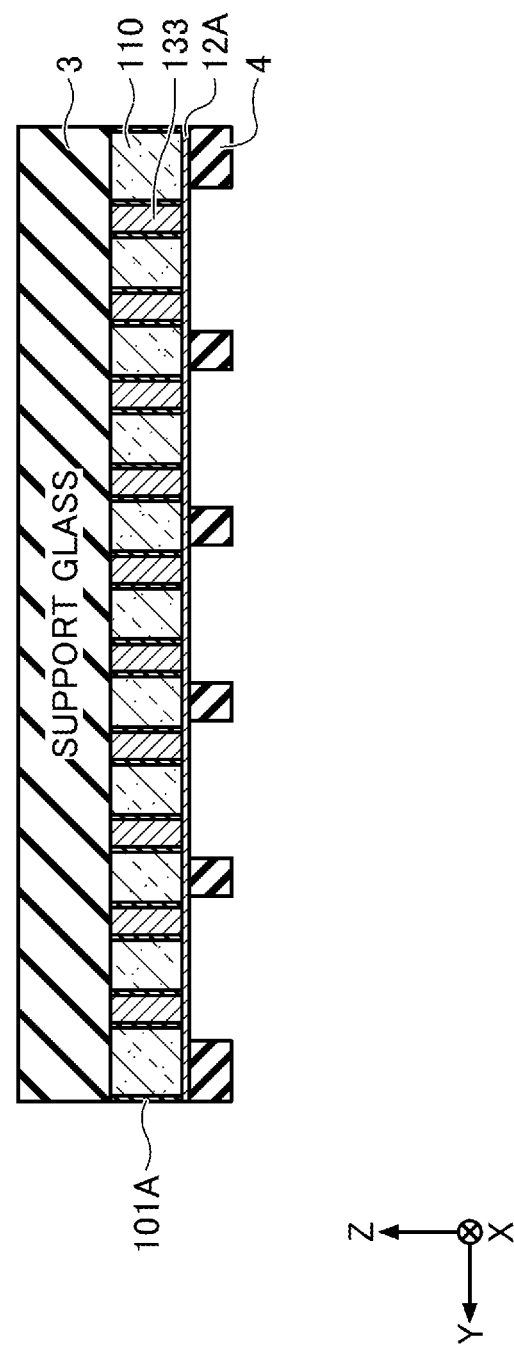
FIG. 5D is a diagram illustrating the method of manufacturing the high-frequency circuit board 100.

Next, as illustrated in FIG. 5C, a seed layer 12A of Ti and Cu is formed on the lower surface, and further, a resist 4 is formed on the lower surface of the seed layer 12A, as illustrated in FIG. 5D. The resist 4 is provided to separate the metal layer 130C in the Y direction. The resist 4 may be formed in substantially the same way as the resist 1 illustrated in FIG. 2A.

Next, as illustrated in FIG. 6A, a Cu plating layer 13A is formed, and further, the resist 4 and part of the seed layer 12A positioned above the resist 4 are removed, as illustrated in FIG. 6B.

Figure 6C:
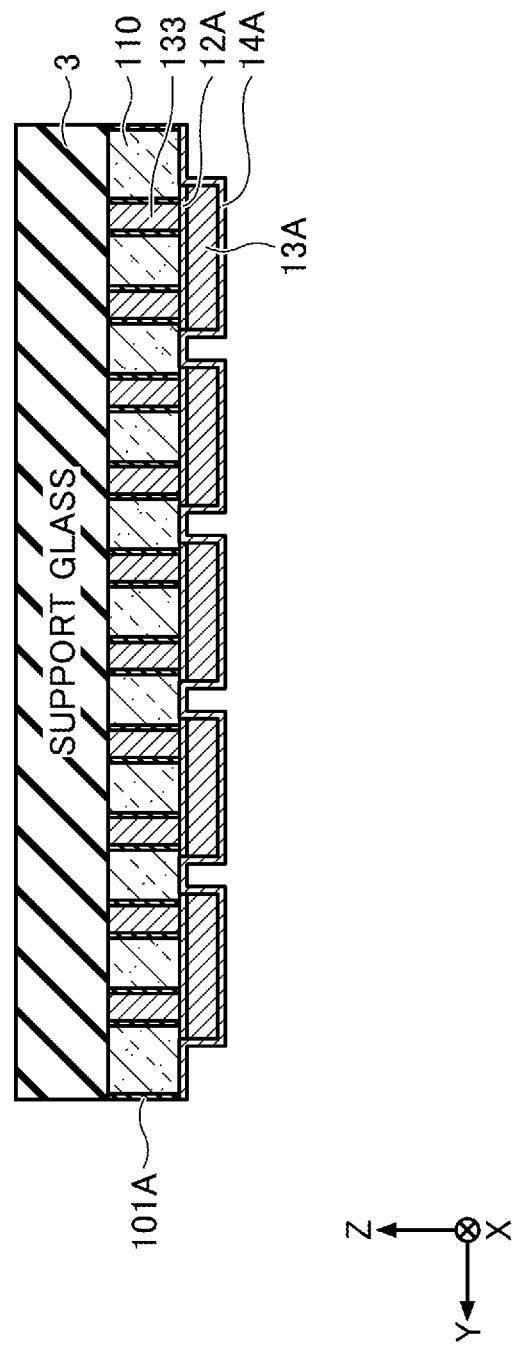
FIG. 6C is a diagram illustrating the method of manufacturing the high-frequency circuit board 100.

Next, Ti is sputtered on the entire lower surface in FIG. 6B, to form a Ti layer 14A as illustrated in FIG. 6C, and further, the support glass 3 is stripped as illustrated in FIG. 6D.

Figure 7A:
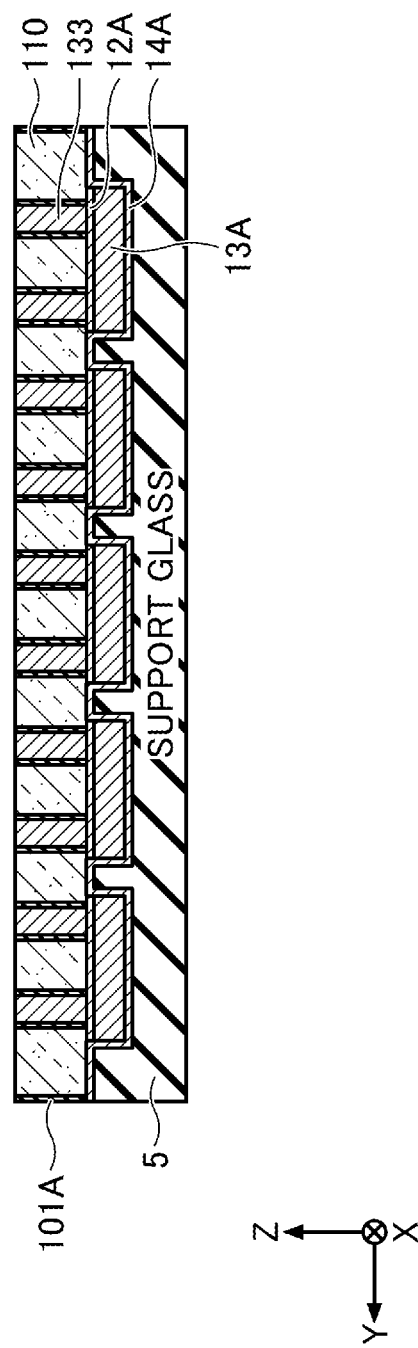
FIG. 7A is a diagram illustrating the method of manufacturing the high-frequency circuit board 100.

Next, as illustrated in FIG. 7A, a support glass 5 is bonded to the lower surface. Unevenness due to the Cu plating layer 13A on the lower surface side of the insulating layer 110 is absorbed by an adhesive filling in dented spaces.

Figure 7B:
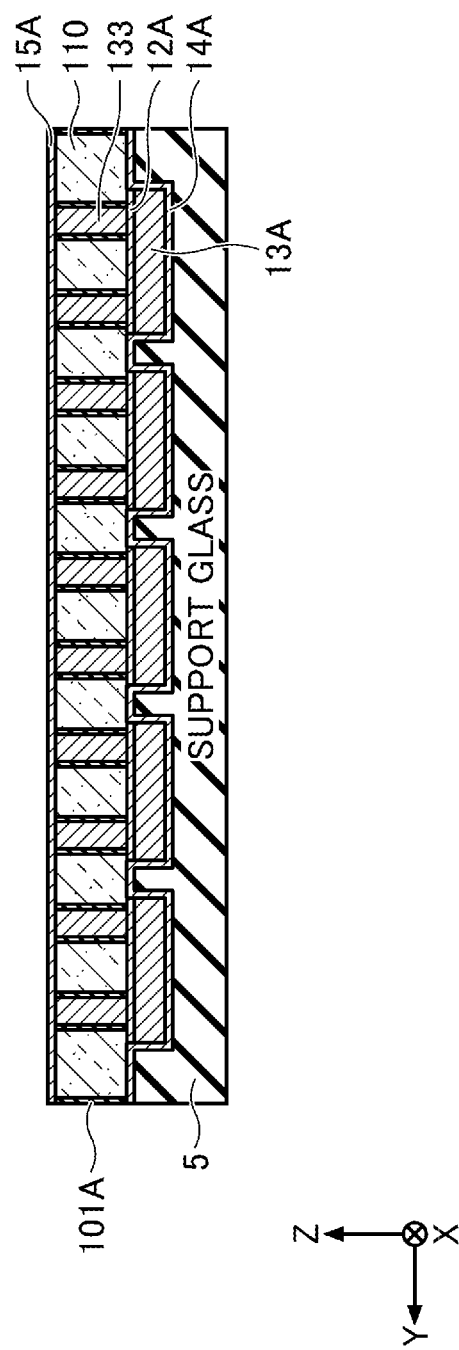
FIG. 7B is a diagram illustrating the method of manufacturing the high-frequency circuit board 100.

Next, as illustrated in FIG. 7B, a Cu plating layer 15A is formed on the insulating layer 110 by copper plating. Note that when forming the Cu plating layer 15A, copper plating may be executed after forming a seed layer of Ti and Cu on the upper surface of the insulating layer 110.

Next, as illustrated in FIG. 7C, a resist 6 is formed. The resist 6 has through holes in portions where the vias 135 (see FIGS. 1 and 7D) are to be formed later. The resist 6 may be formed in substantially the same way as the resist 1 illustrated in FIG. 2A. The resist 6 may be formed on part of the upper surface of the Cu plating layer 15A where the vias 135 are not to be formed.

Figure 7D:
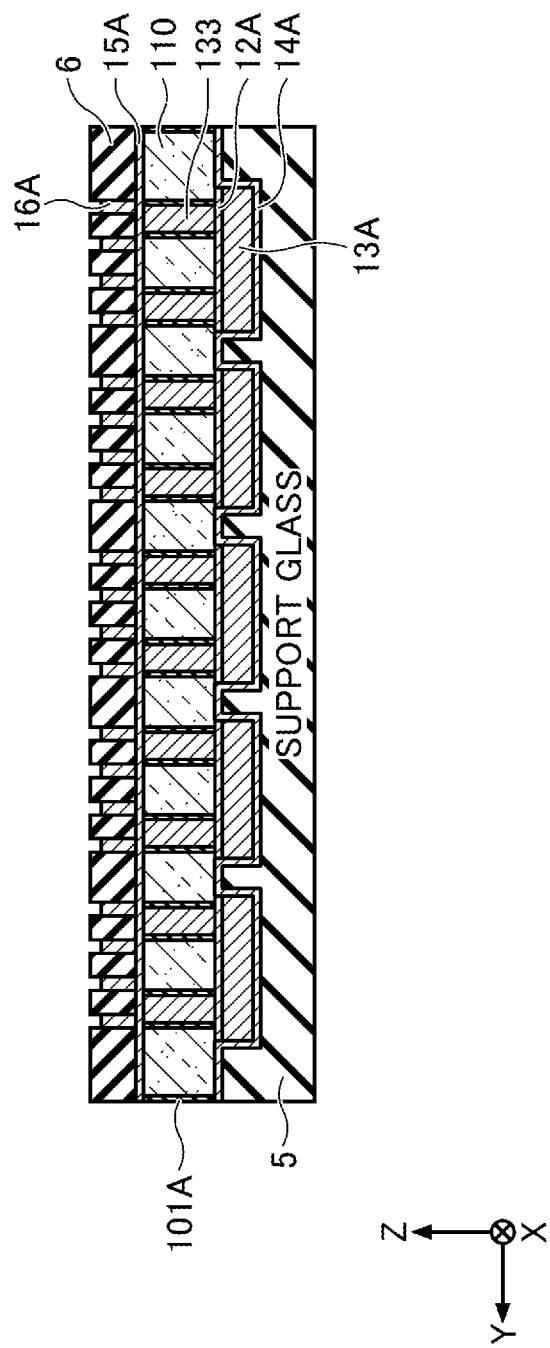
FIG. 7D is a diagram illustrating the method of manufacturing the high-frequency circuit board 100.

Next, as illustrated in FIG. 7D, by executing copper plating using the resist 6, Cu pillars 16A are formed on the upper surface of the Cu plating layer 15A. The Cu pillars 16A become the vias 135 later. The Cu pillars 16A are formed at intervals of less than or equal to 100 µm.

Figure 8A:
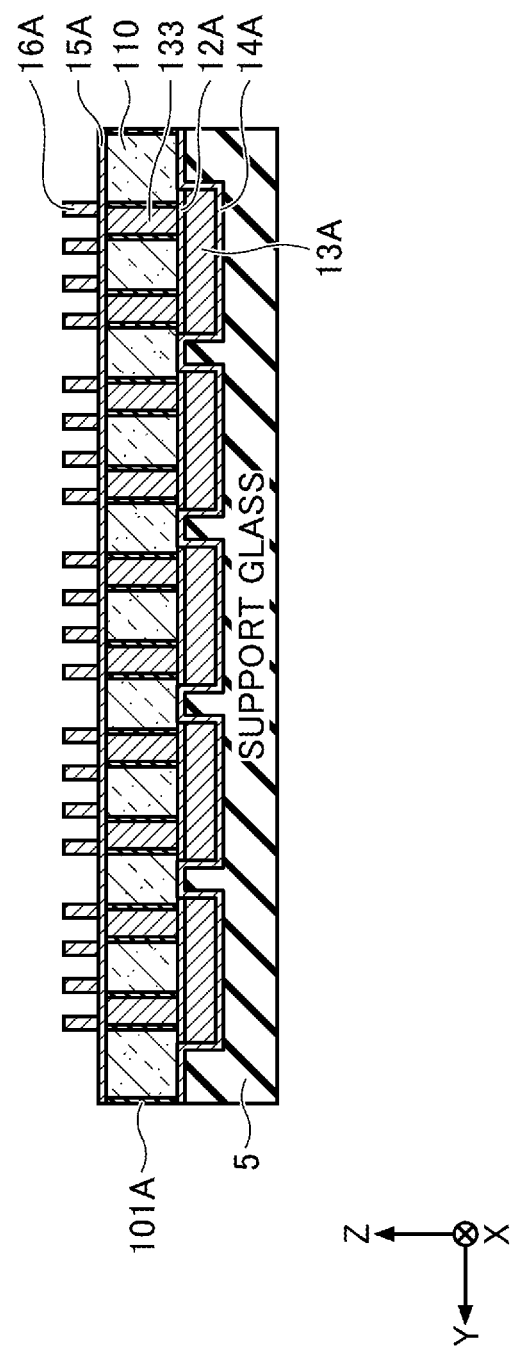
FIG. 8A is a diagram illustrating the method of manufacturing the high-frequency circuit board 100.

Next, the resist 6 illustrated in FIG. 7D is removed to obtain a structure in FIG. 8A. In this state, the Cu pillars 16A are exposed.

Next, as illustrated in FIG. 8B, a resist 7 is formed on the Cu pillars 16A. The resist 7 is formed to separate the Cu plating layer 15A in the Y direction. A region where the resist 7 is not formed is a region that separates the Cu plating layer 15A. Note that the resist 7 may be formed in substantially the same way as the resist 1 illustrated in FIG. 2A.

Figure 8C:
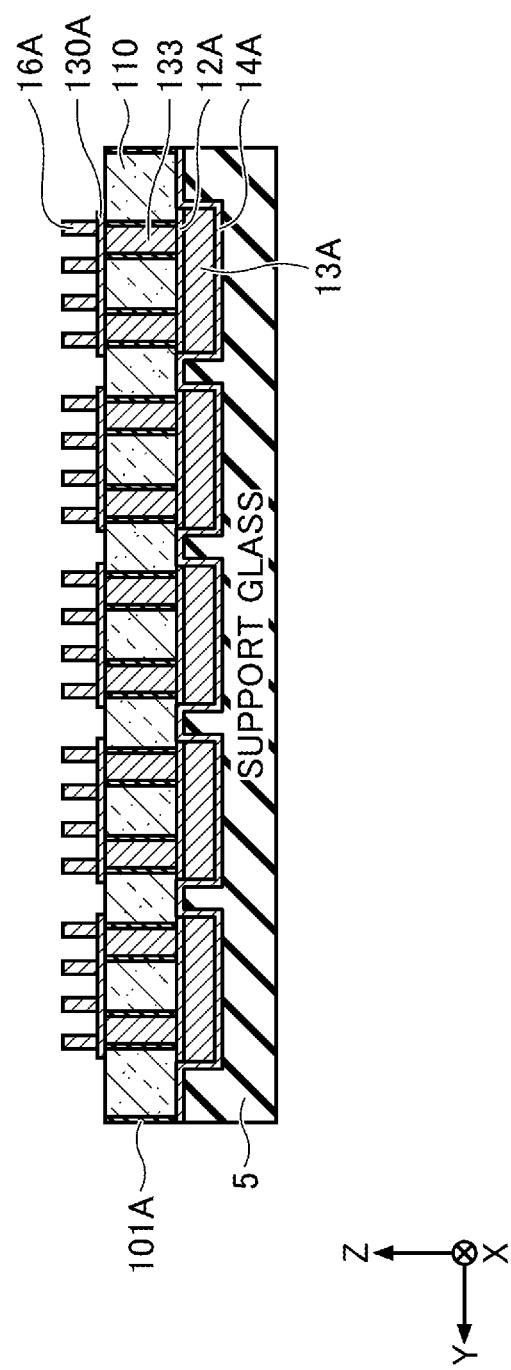
FIG. 8C is a diagram illustrating the method of manufacturing the high-frequency circuit board 100.

Next, once the unnecessary portions of the Cu plating layer 15A are removed using the resist 7, the metal layer 130A is obtained as the Cu plating layer 15A having the unnecessary portions removed, as illustrated in FIG. 8C.

Figure 8D:
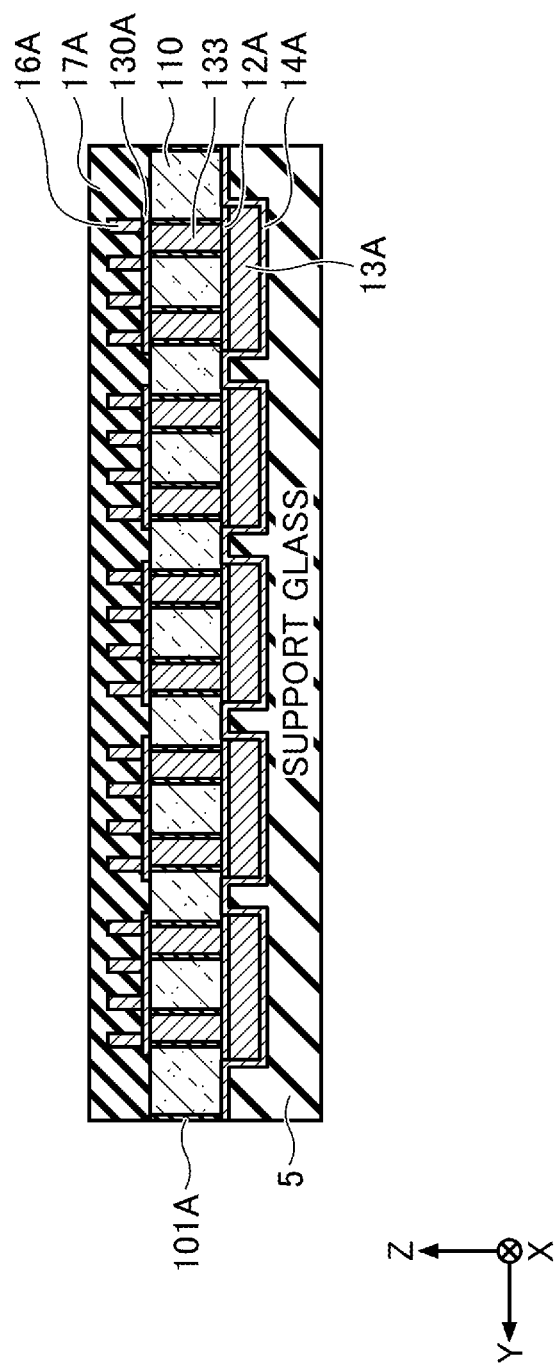
FIG. 8D is a diagram illustrating the method of manufacturing the high-frequency circuit board 100.

Next, as illustrated in FIG. 8D, by applying polyimide onto the entire upper surface and firing the upper surface, a polyimide layer 17A covering the Cu pillars 16A is formed. The polyimide layer 17A is formed to be sufficiently thick so as to cover the upper ends of the Cu pillars 16A.

Figure 9A:
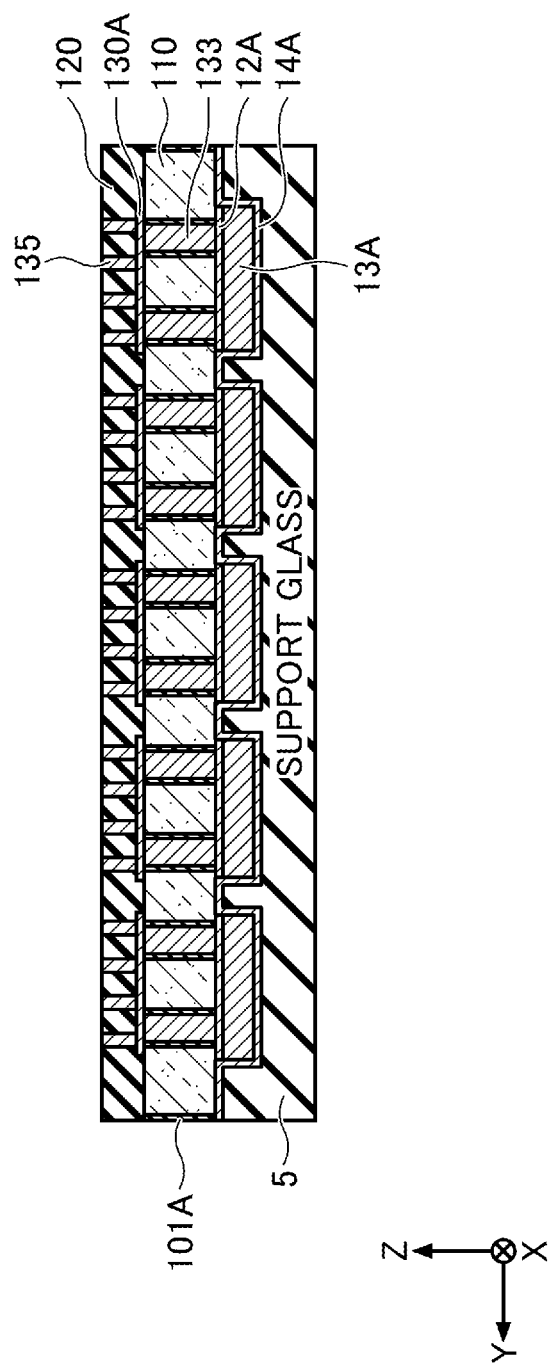
FIG. 9A is a diagram illustrating the method of manufacturing the high-frequency circuit board 100.

Next, the upper surface of the polyimide layer 17A is polished by CMP until reaching the upper end of the Cu pillars 16A, so as to flatten the upper ends of the Cu pillars 16A and the upper surface of the polyimide layer 17A, as illustrated in FIG. 9A. By this process, the Cu pillars 16A become the vias 135, and the polyimide layer 17A becomes the insulating layer 120.

Figure 9B:
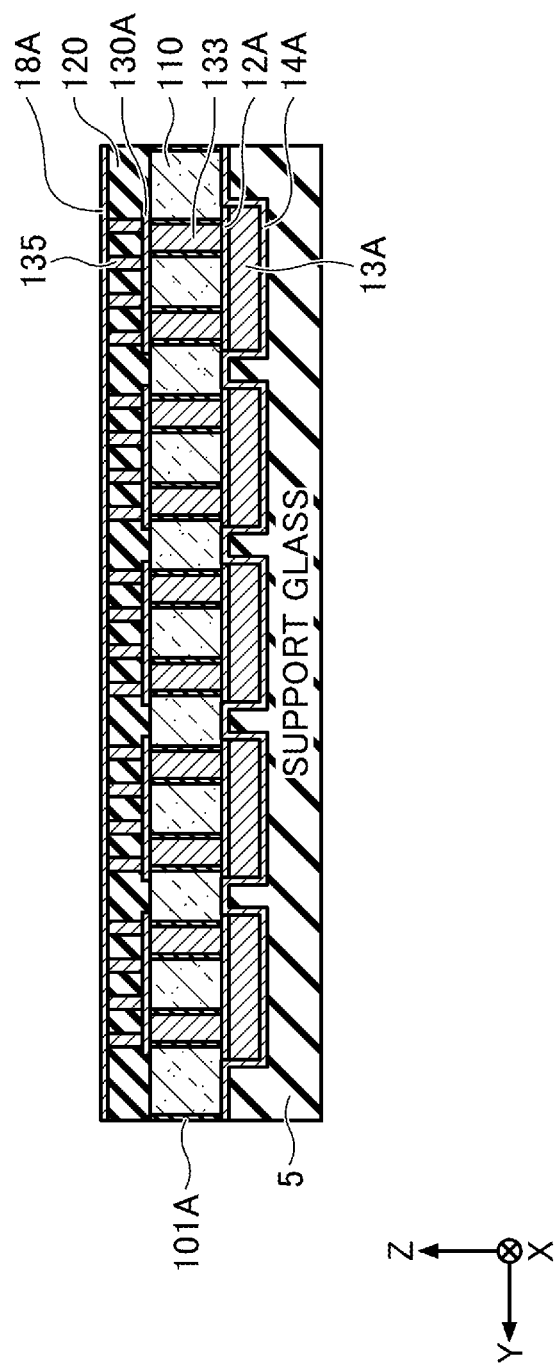
FIG. 9B is a diagram illustrating the method of manufacturing the high-frequency circuit board 100.

Next, as illustrated in FIG. 9B, a seed layer 18A of Ti and Cu is formed on the upper surface of the vias 135 and the insulating layer 120.

Next, as illustrated in FIG. 9C, a resist 8 is formed. The resist 8 is formed to separate the metal layer 130B to be formed later in the Y direction.

Figure 9D:
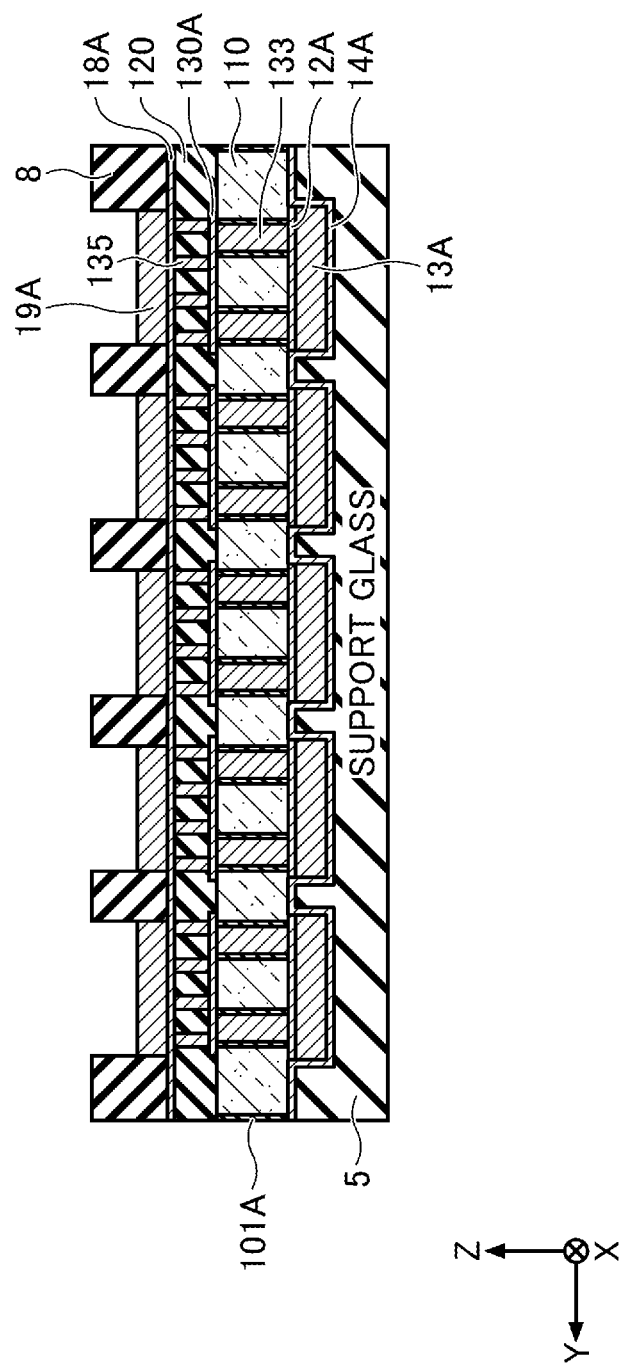
FIG. 9D is a diagram illustrating the method of manufacturing the high-frequency circuit board 100.

Next, as illustrated in FIG. 9D, a Cu plating layer 19A is formed using the resist 8.

Figure 10A:
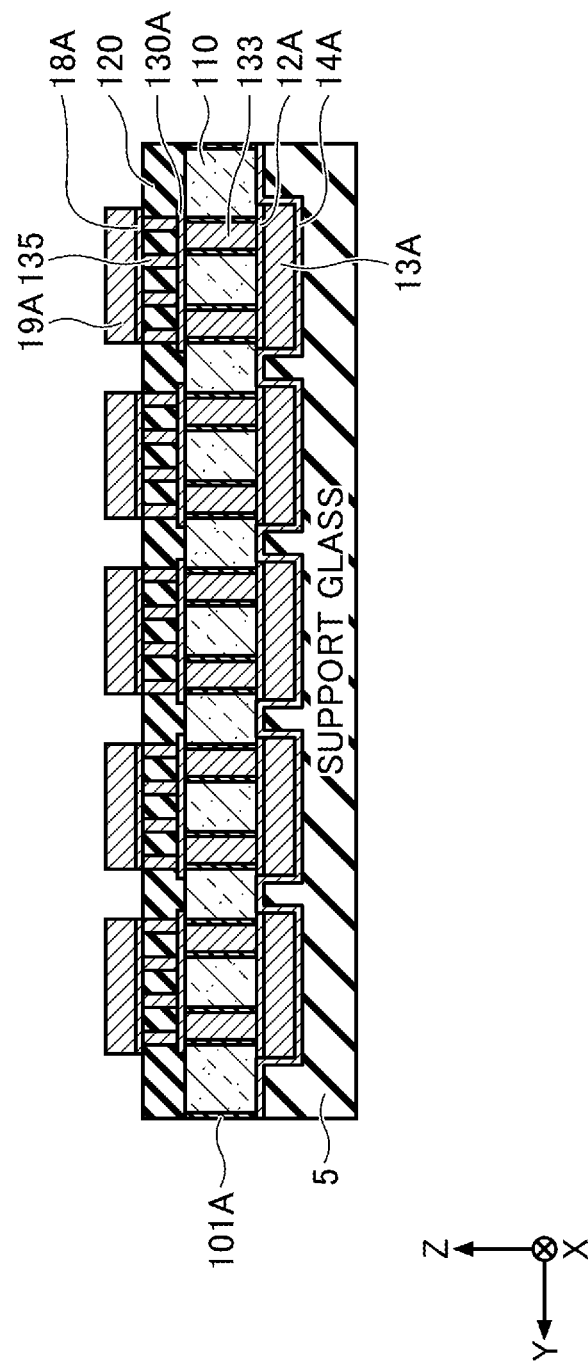
FIG. 10A is a diagram illustrating the method of manufacturing the high-frequency circuit board 100.

Next, as illustrated in FIG. 10A, by removing the resist 8 and etching the entire upper surface, part of the seed layer 18A not covered by the Cu plating layer 19A (part that was under the resist 8) is removed.

Figure 10B:
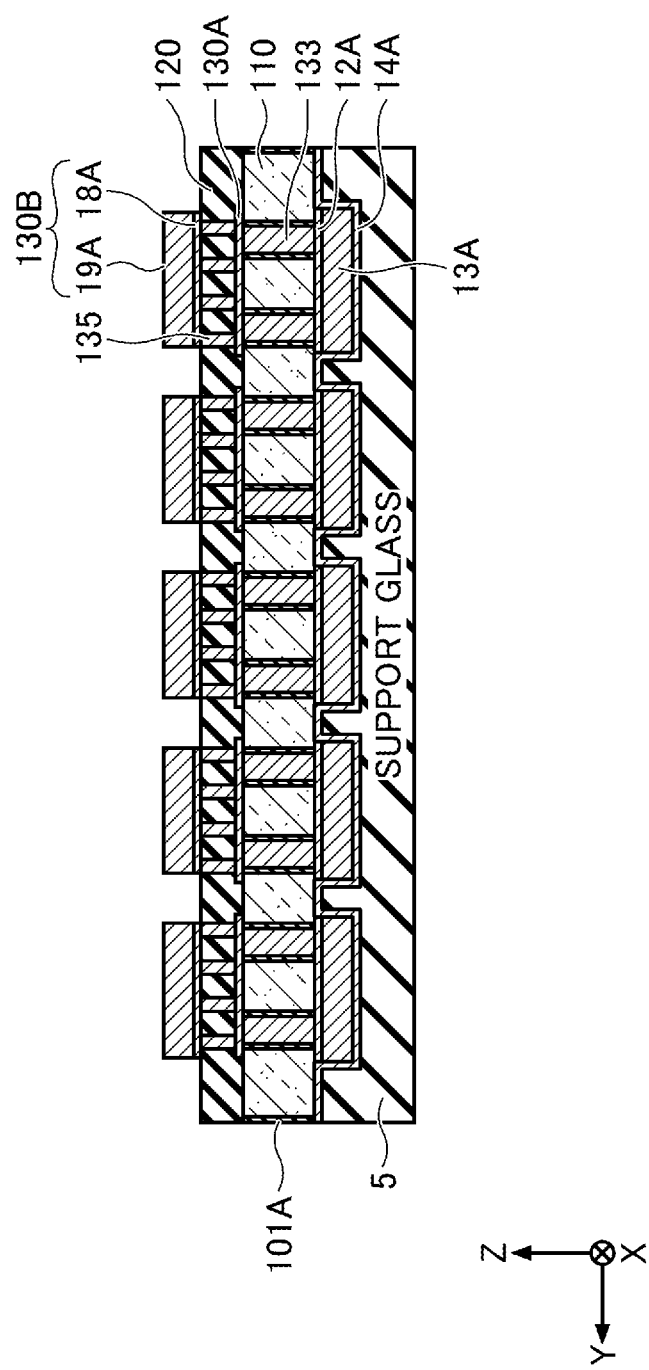
FIG. 10B is a diagram illustrating the method of manufacturing the high-frequency circuit board 100.

Next, in FIG. 10B, as an example, Ni (nickel) and Au (gold) are formed over the Cu plating layer 19A by electroless plating, to have a thickness of 0.13 µm. Accordingly, the seed layer 18A, the Cu plating layer 19A, the Ni layer, and the Au layer form the metal layer 130B. Note that here, although the seed layer 18A and the Cu plating layer 19A are distinguished to describe the manufacturing steps, at the point in time when the Cu plating layer 19A is formed over the seed layer 18A, the two layers are mixed into one layer. Therefore, in FIG. 10B, the mixed layer of the seed layer 18A and the Cu plating layer 19A is illustrated as the metal layer 130B.

Figure 10D:
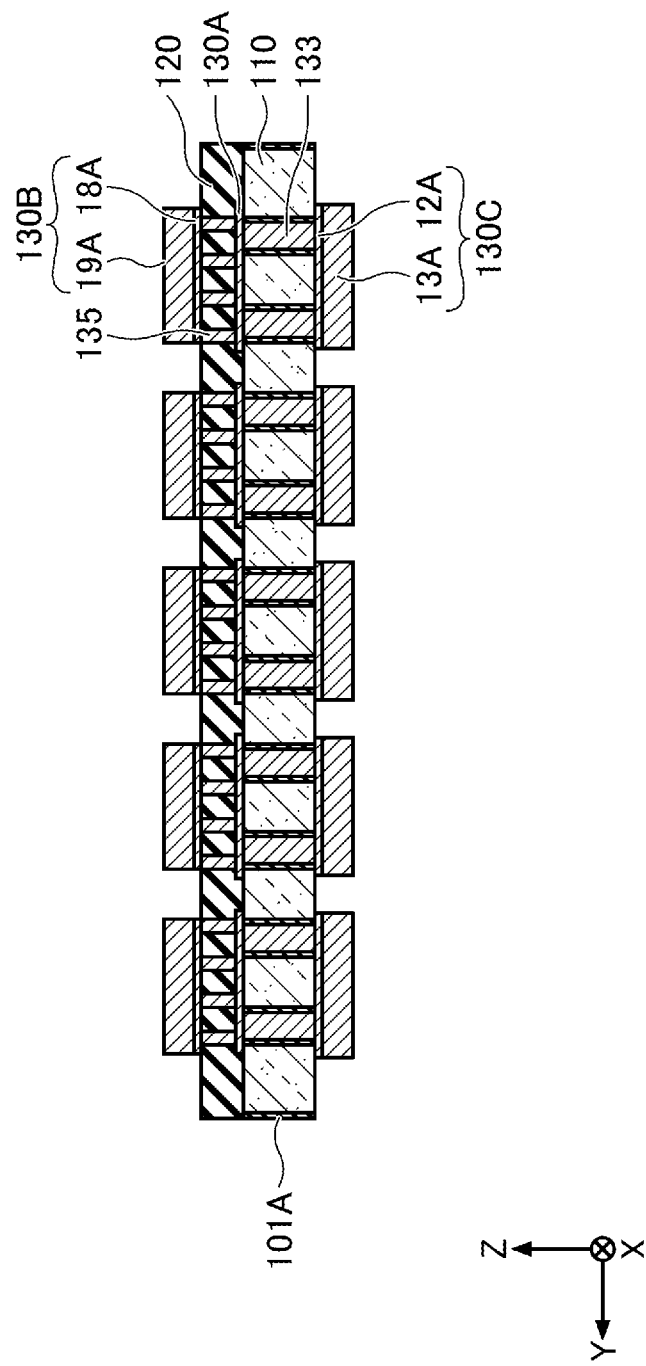
FIG. 10D is a diagram illustrating the method of manufacturing the high-frequency circuit board 100.

Next, as illustrated in FIG. 10C, the support glass 5 is stripped, and further, the side surface and lower surface of the Cu plating layer 13A and the Ti layer 14A on the lower surface of the insulating layer 110 are stripped, as illustrated in FIG. 10D. The seed layer 12A and the Cu plating layer 13A become the metal layer 130C. Here, although the seed layer 12A and the Cu plating layer 13A are distinguished to describe the manufacturing steps, at the point in time when the Cu plating layer 13A is formed over the seed layer 12A, the two layers are mixed into one layer. Therefore, in FIG. 10D, the mixed layer of the seed layer 12A and the Cu plating layer 13A is illustrated as the metal layer 130C. The above manufacturing steps complete the high-frequency circuit board 100.

<Simulation Model of High-Frequency Circuit Board 100>

FIG. 11 is a diagram illustrating a simulation model of the high-frequency circuit board 100. Here, the high-frequency circuit board 100 is simplified, in which the insulating layers 110 and 120 are assumed to have the same size.

The metal layer 130B is positioned as the topmost layer of the simulation model. In FIG. 11, the positions of the vias 133 in plan view are indicated by dash-dotted circles, and the positions of the vias 135 are indicated by dashed circles.

Between three metal layers 130B arranged in the Y direction, two transmission lines 140 are provided. The transmission lines 140 are connected to signal terminals of the power amplifier 50, and through vias that penetrate the insulating layer 120, connected to through hole vias that are formed on part of the upper surface and the lower surface of the insulating layer 110 where the metal layers 130A and 130B are not provided.

<Simulation Results>

Figure 12A:
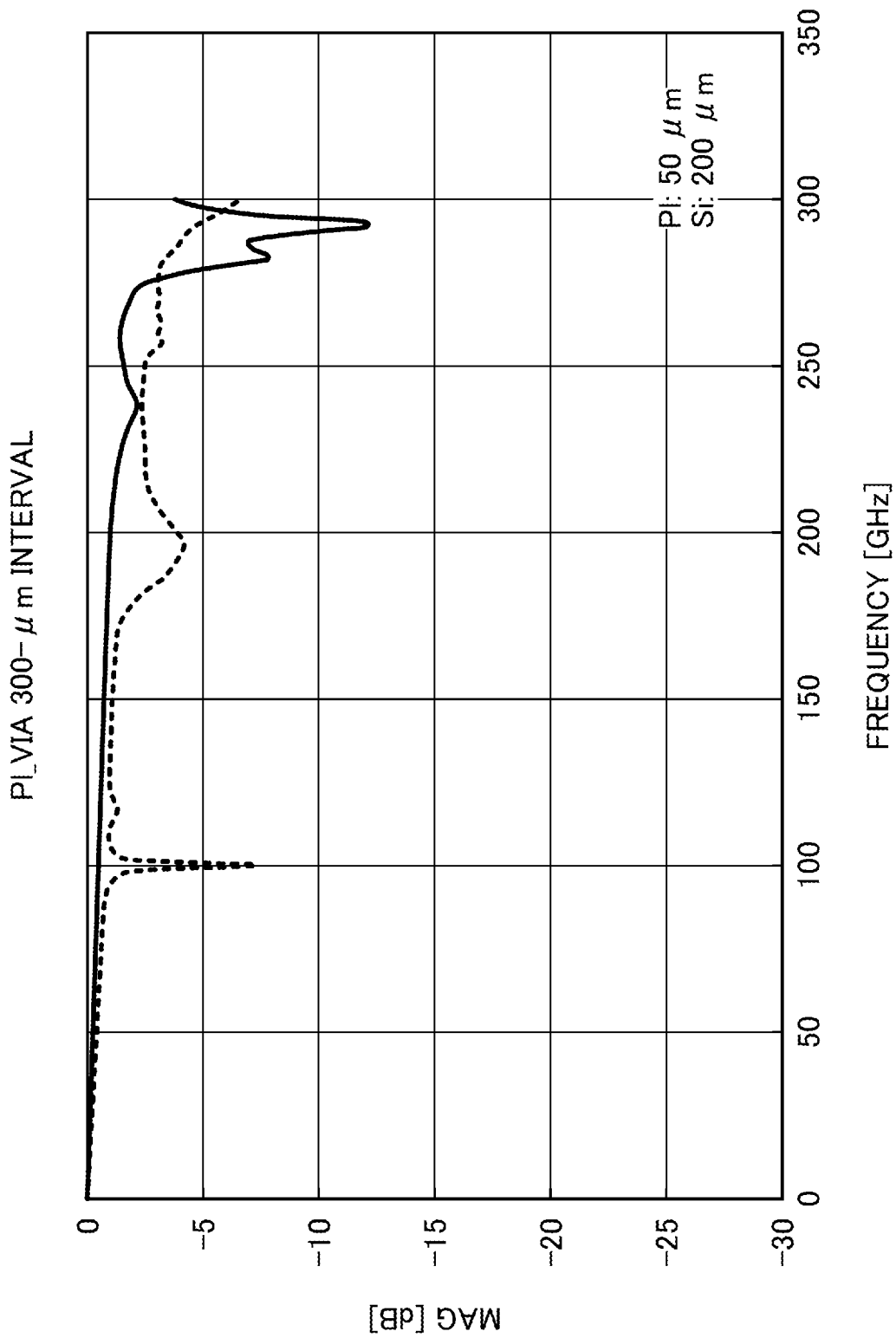
FIG. 12A is a diagram illustrating a simulation result.
Figure 12B:
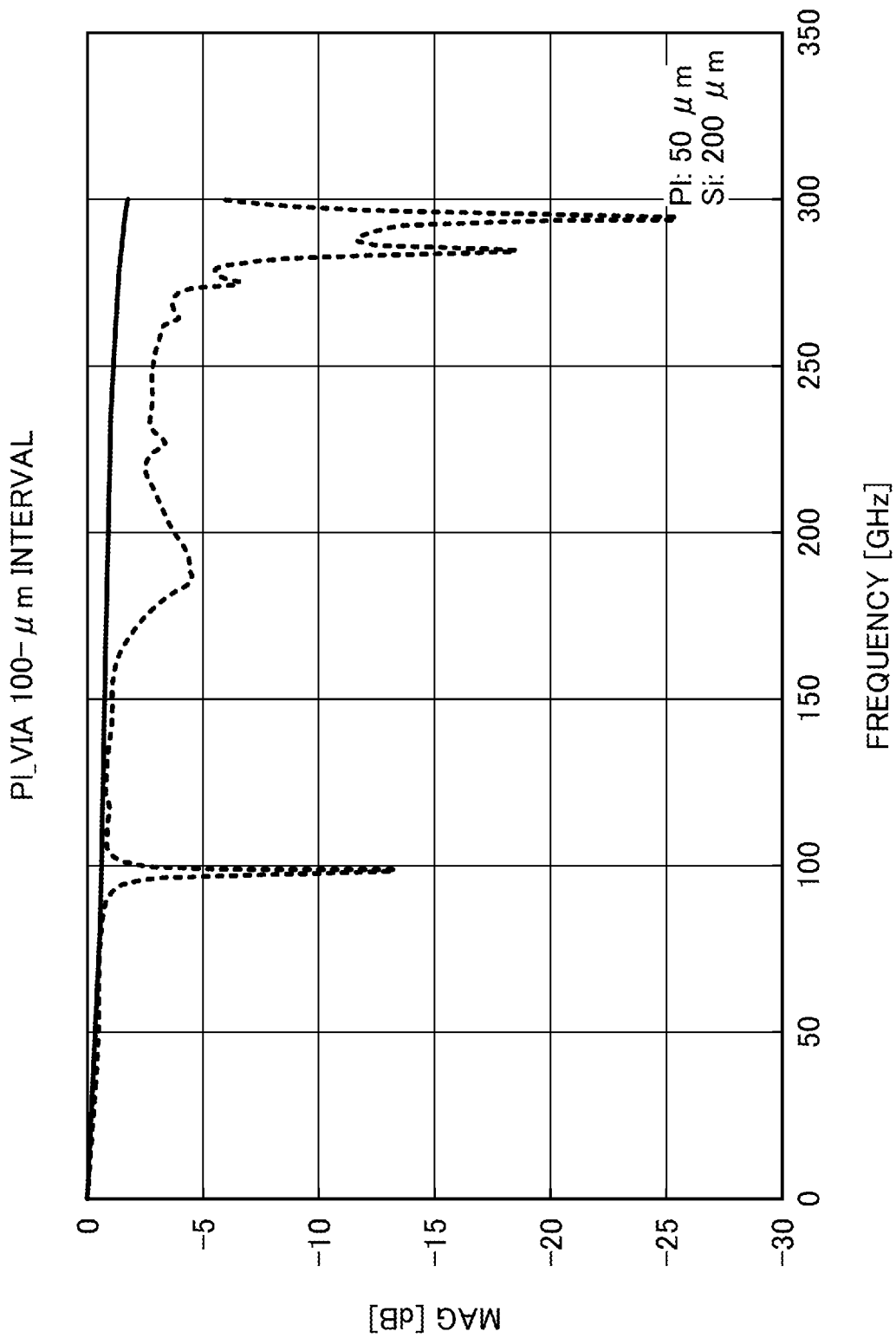
FIG. 12B is a diagram illustrating a simulation result.
Figure 12C:
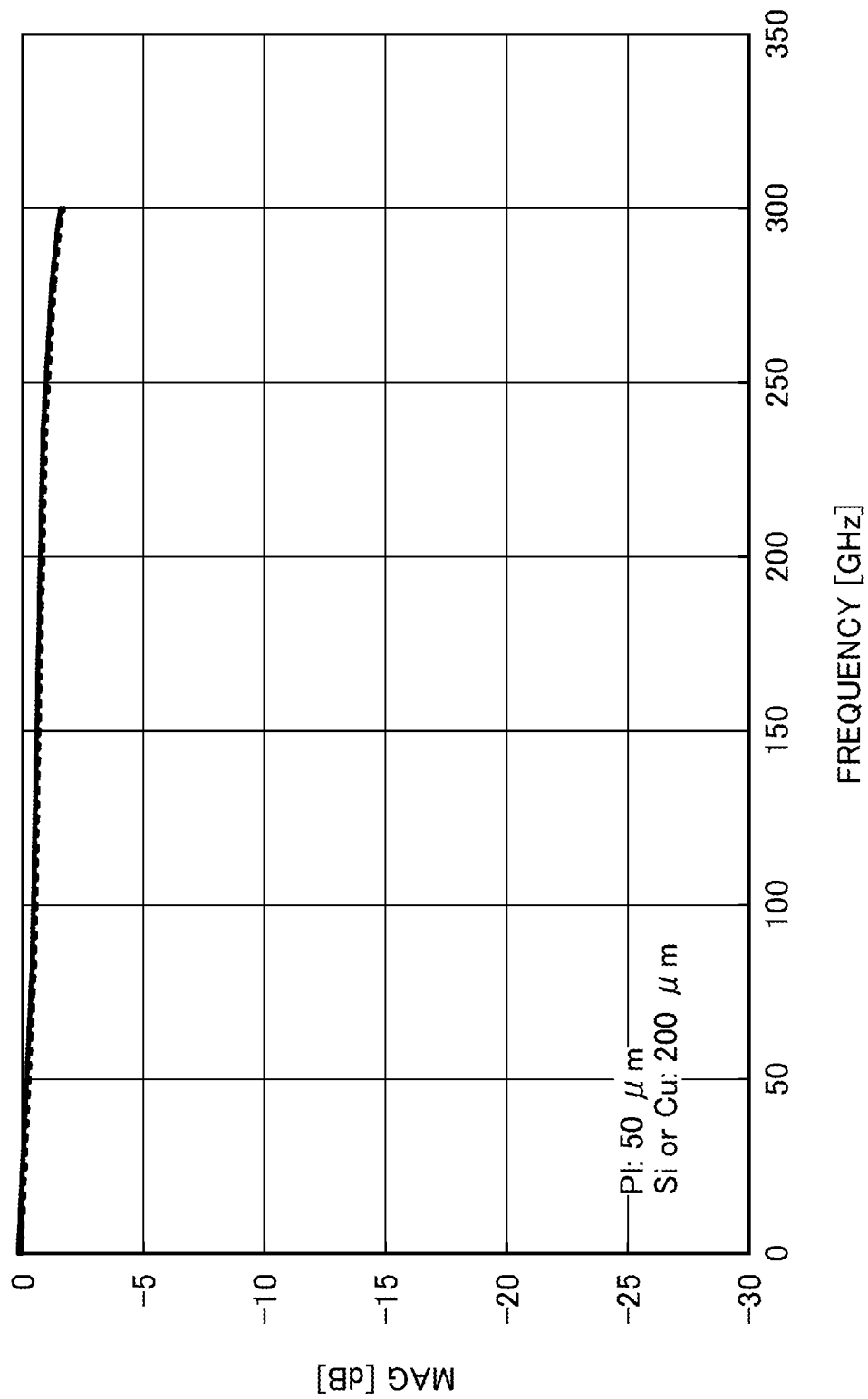
FIG. 12C is a diagram illustrating a simulation result.

FIGS. 12A to 12C are diagrams illustrating simulation results. In FIGS. 12A to 12C, the horizontal axis represents frequency (GHz) and the vertical axis represents MAG (maximum available gain) (dB). In the simulation model, the thickness of the insulating layer 110 was set to 200 μm, and the thickness of the insulating layer 120 was set to 50 μm, to calculate the maximum available gain (MAG) between ends on the negative X direction side and ends on the positive X direction side of the transmission lines 140.

FIG. 12A illustrates a frequency characteristic of the MAG by a solid line, in the case where the interval between the vias 135 is set to 300 μm in the high-frequency circuit board 100. Also, FIG. 12A illustrates a frequency characteristic of the MAG by a dashed line, in the case where the interval between the vias 135 is set to 300 μm in a comparative high-frequency circuit board not including a metal layer 130A. The comparative high-frequency circuit board has a configuration in which the metal layer 130A is omitted from the high-frequency circuit board 100, and the vias 133 and 135 are directly connected.

As illustrated in FIG. 12A, the comparative high-frequency circuit board (dashed line) had a low MAG around 100 GHz, which caused a loss, whereas such a loss was improved in the high-frequency circuit board 100 (solid line). Also, although the high-frequency circuit board 100 (solid line) exhibited an improvement in MAG over the comparative high-frequency circuit board (dashed line), especially within a range of approximately 170 GHz to approximately 280 GHz, the MAG decreased at approximately 280 GHz or higher, and exhibited values lower than those of the comparative high-frequency circuit board (dashed line).

FIG. 12B illustrates the frequency characteristic of the MAG by a solid line, in the case where the interval between the vias 135 is set to 100 μm in the high-frequency circuit board 100. Also, FIG. 12B illustrates the frequency characteristic of the MAG by a dashed line, in the case where the interval between the vias 135 is set to 100 μm in the comparative high-frequency circuit board. The comparative high-frequency circuit board has a configuration in which the metal layer 130A is omitted from the high-frequency circuit board 100, and the vias 133 and 135 are directly connected.

As illustrated in FIG. 12B, although the comparative high-frequency circuit board (dashed line) had a low MAG around 100 GHz, which caused a loss, the loss was greater than the characteristic illustrated in FIG. 12A. The high-frequency circuit board 100 (solid line) exhibited good MAG values in a whole range up to 300 GHz, and exhibited a good value of approximately-2 dB at 300 GHz, although it decreased a bit on the higher frequency side. The high-frequency circuit board 100 exhibited an effective improvement on the high-frequency side (especially 200 GHz or higher) with the interval of 100 μm, as compared with the interval of 300 μm illustrated in FIG. 12A.

FIG. 12C illustrates the frequency characteristic of the MAG by a solid line, in the case where the interval between the vias 135 is set to 100 μm in the high-frequency circuit board 100. The characteristic of the solid line is the same as that illustrated in FIG. 12B. Also, for comparison, FIG. 12C illustrates a frequency characteristic of the MAG in a dashed line in the case where the interval of the vias 135 was set to 100 μm for a second comparative high-frequency circuit board without an insulating layer 110, a metal layer 130C, and vias 133. The second comparative high-frequency circuit board has a configuration in which the insulating layer 110, the metal layer 130C, and the vias 133 are omitted from the high-frequency circuit board 100. In other words, the second comparative high-frequency circuit board includes an insulating layer 120, a metal layer 130A, a metal layer 130B, and vias 135. The second comparative high-frequency circuit board having such a configuration has a good high-frequency characteristic; however, the heat dissipation is not satisfactory.

As illustrated in FIG. 12C, the high-frequency circuit board 100 (solid line) exhibited virtually the same characteristic as the MAG in the second comparative high-frequency circuit board (dashed line). Accordingly, it can be confirmed that even if the insulating layer 110, the vias 133, and the metal layer 130A were provided for heat dissipation, the high frequency characteristic was as good as that of the second comparative high-frequency circuit board including the insulating layer 120, the metal layer 130A, the metal layer 130B, and the vias 135, without including the insulating layer 110, the metal layer 130C, and the vias 133.

Effects

As above, the high-frequency circuit board 100 includes the insulating layer 110 having the first dielectric constant; the metal layer 130A provided to stack over the insulating layer 110; the insulating layer 120 provided to stack over the metal layer 130A, and having the second dielectric constant lower than the first dielectric constant; the metal layer 130B provided to stack over the insulating layer 110 on which the power amplifier 50 is mounted; and the vias 135 penetrating the insulating layer 110 and connecting the metal layer 130A with the metal layer 130B. The metal layer 130B on which the power amplifier 50 is mounted is provided on the insulating layer 110 that has a lower dielectric constant than the insulating layer 110, and the metal layer 130A is provided between the insulating layer 110 and the insulating layer 110; therefore, signal components output from the power amplifier 50 through the vias 135 are blocked by the metal layer 130A. Also, the insulating layer 110 is provided on the lower surface side of the metal layer 130A; therefore, heat dissipation can be ensured.

Therefore, the high-frequency circuit board 100 having good heat dissipation and high frequency characteristic, and an antenna module can be provided.

Also, the high-frequency circuit board 100 further includes the metal layer 130C that is arranged on the opposite side of the metal layer 130A with respect to the insulating layer 110, and is held at reference potential (ground potential); and the vias 133 that penetrate the insulating layer 110 to connect the metal layer 130A with the metal layer 130C. Therefore, the high-frequency circuit board 100 that can dissipate heat from the metal layer 130A through the vias 133 using the metal layer 130C to have better heat dissipation, can be provided.

In addition, the metal layer 130A and the metal layer 130C are formed in part of a region where the insulating layer 110 is present in plan view; therefore, the vias connected to the power amplifier 50 can pass through the insulating layer 110, and the high-frequency characteristic can be made better. Therefore, the high-frequency circuit board 100 having a better high frequency characteristic can be provided.

In addition, the insulating layer 120 is a resin layer or a quartz layer, and hence, has a low dielectric constant that can make the high-frequency characteristic even better. Therefore, the high-frequency circuit board 100 having a better high frequency characteristic can be provided.

In addition, the thickness of the insulating layer 120 is less than ¼ of the wavelength at a frequency of a signal processed by the compound semiconductor device. Therefore, the vias 135 can be suppressed from functioning as radiating elements, and the high-frequency characteristic can be made even better. Therefore, the high-frequency circuit board 100 having a better high frequency characteristic can be provided.

In addition, the insulating layer 110 is made of SiC, AlN, or Si, and thereby, has a high thermal conductivity, and can more effectively dissipate heat conducted to the metal layer 130A; thus, the high-frequency circuit board 100 that has better heat dissipation can be provided.

In addition, the thickness of the insulating layer 110 is greater than or equal to ¼ of the wavelength at a frequency of a signal input into the compound semiconductor device, and thereby, the insulating layer 110 has a high thermal conductivity, and can more effectively dissipate heat conducted to the metal layer 130A; thus, the high-frequency circuit board 100 that has better heat dissipation can be provided.

In addition, the thickness of the insulating layer 110 is greater than or equal to 100 μm, and thereby, the thermal conductivity of the insulating layer 110 is high, and can more effectively dissipate heat conducted to the metal layer 130A; thus, the high-frequency circuit board 100 that has better heat dissipation can be provided.

In addition, the interval of the vias 135 is less than 100 μm, and thereby, good MAG values are obtained, especially as a high frequency characteristic at 200 GHz or higher; thus, the high-frequency circuit board 100 whose high frequency characteristic is even better can be provided.

<Antenna Module 100A>

FIG. 13 is a diagram schematically illustrating a configuration of an antenna module 100A. The antenna module 100A includes a high-frequency circuit board 100, a power amplifier 50, and an antenna 50A.

The antenna 50A may be attached to the power amplifier 50, or may be connected to the power amplifier 50 in a state of being formed on the board or the like. Also, although FIG. 13 illustrates, as an example, a configuration in which radio waves are emitted in lateral directions (negative X direction), the radio waves may be emitted upward, or may be emitted in any other directions. The antenna 50A may be, for example, an array antenna, a horn antenna, or any other type of antenna.

As described above, the high-frequency circuit board 100 has good heat dissipation and a frequency characteristic; therefore, the antenna module 100A having good heat dissipation and a high-frequency characteristic can be provided.

As above, the high-frequency circuit board and the antenna module of the illustrative embodiments in the present disclosure have been described; note that the present disclosure is not limited to the specifically disclosed embodiments, and various modifications and alteration can be made without departing from the scope of the claims. With respect to the above embodiments, the following additional notes are further disclosed.

(Note 1)
A high-frequency circuit board comprising:
a first insulating layer having a first dielectric constant;
a first metal layer provided to stack over the first insulating layer;
a second insulating layer provided to stack over the first metal layer, and having a second dielectric constant lower than the first dielectric constant;
a second metal layer provided to stack over the second insulating layer, on which a compound semiconductor device is mounted; and
first vias penetrating the second insulating layer and connecting the first metal layer with the second metal layer.

(Note 2)
The high-frequency circuit board as described in Note 1, further comprising:
a third metal layer arranged on an opposite side to the first metal layer with respect to the first insulating layer, and held at reference potential; and
second vias penetrating the first insulating layer and connecting the first metal layer with the third metal layer.

(Note 3)
The high-frequency circuit board as described in Note 2, wherein the first metal layer and the third metal layer are formed in part of a region where the first insulating layer is present in plan view.

(Note 4)
The high-frequency circuit board as described in any one of Notes 1 to 3, wherein the second insulating layer is a resin layer or a quartz layer.

(Note 5)
The high-frequency circuit board as described in any of Notes 1 to 4, wherein the second dielectric constant is less than or equal to 4.

(Note 6)
The high-frequency circuit board as described in any one of Notes 1 to 5, wherein a thickness of the second insulating layer is less than ¼ of a wavelength at a frequency of a signal at which the compound semiconductor device processes the signal.

(Note 7)
The high-frequency circuit board as described in any one of Notes 1 to 6, wherein the second insulating layer is made of SiC, AlN, or Si.

(Note 8)
The high-frequency circuit board as described in any one of Notes 1 to 7, wherein a thickness of the first insulating layer is greater than or equal to ¼ of a wavelength at a frequency of a signal input into the compound semiconductor device.

(Note 9)

The high-frequency circuit board as described in any one of Notes 1 to 7, wherein the first insulating layer has a thickness of greater than or equal to 100 μm.

(Note 10)

The high-frequency circuit board as described in any one of Notes 1 to 9, wherein an interval between the first vias is less than or equal to 100 μm.

(Note 11)

An antenna module comprising:
an antenna; and
a high-frequency circuit board on which the antenna is mounted,
wherein the high-frequency circuit board includes:
a first insulating layer having a first dielectric constant,
a first metal layer provided to stack over the first insulating layer,
a second insulating layer provided to stack over first metal layer, and having a second permittivity lower than the first permittivity,
a second metal layer provided to stack over second insulating layer, on which a compound semiconductor device is mounted, and
first vias penetrating the second insulating layer and connecting the first metal layer with the second metal layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A high-frequency circuit board comprising: a first insulating layer having a first dielectric constant; a first metal layer provided to stack over the first insulating layer; a second insulating layer provided to stack over the first metal layer, and having a second dielectric constant lower than the first dielectric constant; a second metal layer provided to stack over the second insulating layer, on which a compound semiconductor device is mounted; and first vias penetrating the second insulating layer and connecting the first metal layer with the second metal layer, further comprising: a third metal layer arranged on an opposite side to the first metal layer with respect to the first insulating layer, and held at reference potential; and second vias penetrating the first insulating layer and connecting the first metal layer with the third metal layer.

2. The high-frequency circuit board as claimed in claim 1, wherein the first metal layer and the third metal layer are formed in part of a region where the first insulating layer is present in plan view.

3. The high-frequency circuit board as claimed in claim 1, wherein the second insulating layer is a resin layer or a quartz layer.

4. The high-frequency circuit board as claimed in claim 1, wherein a thickness of the second insulating layer is less than ¼ of a wavelength at a frequency of a signal at which the compound semiconductor device processes the signal.

5. The high-frequency circuit board as claimed in claim 1, wherein the second insulating layer is made of SiC, AlN, or Si.

6. The high-frequency circuit board as claimed in claim 1, wherein a thickness of the first insulating layer is greater than or equal to ¼ of a wavelength at a frequency of a signal input into the compound semiconductor device.

7. The high-frequency circuit board as claimed in claim 1, wherein the first insulating layer has a thickness of greater than or equal to 100 μm.

8. The high-frequency circuit board as claimed in claim 1, wherein an interval between the first vias is less than or equal to 100 μm.

9. An antenna module comprising:
an antenna; and
a high-frequency circuit board on which the antenna is mounted,
wherein the high-frequency circuit board includes:
a first insulating layer having a first dielectric constant,
a first metal layer provided to stack over the first insulating layer,
a second insulating layer provided to stack over the first metal layer, and having a second permittivity lower than a first permittivity,
a second metal layer provided to stack over the second insulating layer, on which a compound semiconductor device is mounted, and
first vias penetrating the second insulating layer and connecting the first metal layer with the second metal layer.

* * * * *